(12) United States Patent
Lai et al.

(10) Patent No.: US 10,916,560 B2
(45) Date of Patent: Feb. 9, 2021

(54) CRENELLATED CHARGE STORAGE STRUCTURES FOR 3D NAND

(71) Applicant: MACRONIX INTERNATIONAL CO., LTD., Hsinchu (TW)

(72) Inventors: Erh-Kun Lai, Longling Shiang (TW); Hsiang-Lan Lung, Kaohsiung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 12 days.

(21) Appl. No.: 16/247,079

(22) Filed: Jan. 14, 2019

(65) Prior Publication Data
US 2020/0227432 A1 Jul. 16, 2020

(51) Int. Cl.
| | |
|---|---|
| *H01L 27/11582* | (2017.01) |
| *H01L 27/1157* | (2017.01) |
| *H01L 21/768* | (2006.01) |
| *H01L 23/522* | (2006.01) |
| *H01L 21/28* | (2006.01) |

(52) U.S. Cl.
CPC .. *H01L 27/11582* (2013.01); *H01L 21/76802* (2013.01); *H01L 21/76877* (2013.01); *H01L 23/5226* (2013.01); *H01L 27/1157* (2013.01); *H01L 29/40117* (2019.08)

(58) Field of Classification Search
CPC ........................ H01L 27/11582; H01L 27/1157
See application file for complete search history.

(56) References Cited

U.S. PATENT DOCUMENTS

| | | | | |
|---|---|---|---|---|
| 9,076,879 B2 * | 7/2015 | Yoo | ..................... | H01L 27/1157 |
| 9,773,841 B2 * | 9/2017 | Simsek-Ege | ........ | H01L 27/1158 |
| 9,786,673 B1 * | 10/2017 | Cho | ...................... | H01L 23/528 |
| 9,831,257 B2 | 11/2017 | Lue | | |
| 10,043,819 B1 | 8/2018 | Lai et al. | | |
| 2009/0230458 A1 * | 9/2009 | Ishiduki | ............ | H01L 27/11565 |
| | | | | 257/324 |
| 2010/0181612 A1 | 7/2010 | Kito et al. | | |

(Continued)

OTHER PUBLICATIONS

Cho et al., "Highly reliable vertical NAND technology with biconcave shaped storage layer and leakage controllable offset structure," 2010 Symp. on VLSI Technology Digest of Papers, Jun. 15-17, 2010, 2 pages.

(Continued)

*Primary Examiner* — Eugene Lee

(74) *Attorney, Agent, or Firm* — Haynes Beffel & Wolfeld LLP

(57) ABSTRACT

A memory device comprises a stack of conductive strips separated by insulating layers on a substrate, and a vertical channel structure disposed in a hole through the stack of conductive strips to the substrate. A vertical channel structure is disposed in a hole through the stack of conductive strips to the substrate. Charge storage structures are disposed at cross points of the conductive strips and the vertical channel structure, the charge storage structures including multiple layers of materials. The insulating layers have sidewalls recessed from the vertical channel structure. A charge storage layer of the multiple layers of materials of the charge storage structures lines sidewalls of the insulating layers. Dielectric material is disposed between the vertical channel structure and the charge storage layer on sidewalls of the insulating layers.

22 Claims, 25 Drawing Sheets

(56) References Cited

U.S. PATENT DOCUMENTS

| | | | |
|---|---|---|---|
| 2012/0001249 A1 | 1/2012 | Alsmeier et al. | |
| 2012/0112264 A1* | 5/2012 | Lee | H01L 27/11551 257/324 |
| 2012/0273870 A1* | 11/2012 | Liu | H01L 27/11565 257/324 |
| 2013/0049095 A1 | 2/2013 | Whang et al. | |
| 2013/0100741 A1 | 4/2013 | Choi et al. | |
| 2016/0043100 A1* | 2/2016 | Lee | H01L 27/11565 257/324 |
| 2016/0181271 A1 | 6/2016 | Yada et al. | |
| 2016/0204122 A1* | 7/2016 | Shoji | H01L 27/11582 257/324 |
| 2016/0276358 A1* | 9/2016 | Li | H01L 27/11548 |
| 2016/0365351 A1* | 12/2016 | Nishikawa | H01L 27/1157 |
| 2017/0084748 A1* | 3/2017 | Yang | H01L 29/40114 |
| 2019/0386108 A1* | 12/2019 | Nishikawa | H01L 29/42336 |

OTHER PUBLICATIONS

Choi et al., "Comprehensive evaluation of early retention (fast charge loss within a few seconds) characteristics in tube-type 3-D NAND flash memory," 2016 IEEE Symposium on VLSI Technology, Honolulu, HI, Jun. 14-16, 2016, pp. 1-2.

Lai et al. "A Multi-Layer Stackable Thin-Film Transistor (TFT) NAND-Type Flash Memory," IEDM Aug. 2006, consisting of 6 pages.

Jang et al., "Vertical cell array using TCAT(Terabit Cell Array Transistor) technology for ultra high density NAND flash memory," 2009 Symp. on VLSI Technology, Jun. 16-18, 2009, 2 pages.

Jung et al, "Three Dimensionally Stacked NAND Flash Memory Technology Using Stacking Single Crystal Si Layers on ILD and TANOS Structure for Beyond 30nm Node," International Electron Devices Meeting, 2006. IEDM '06, Dec. 11-13, 2006, pp. 1-4.

* cited by examiner

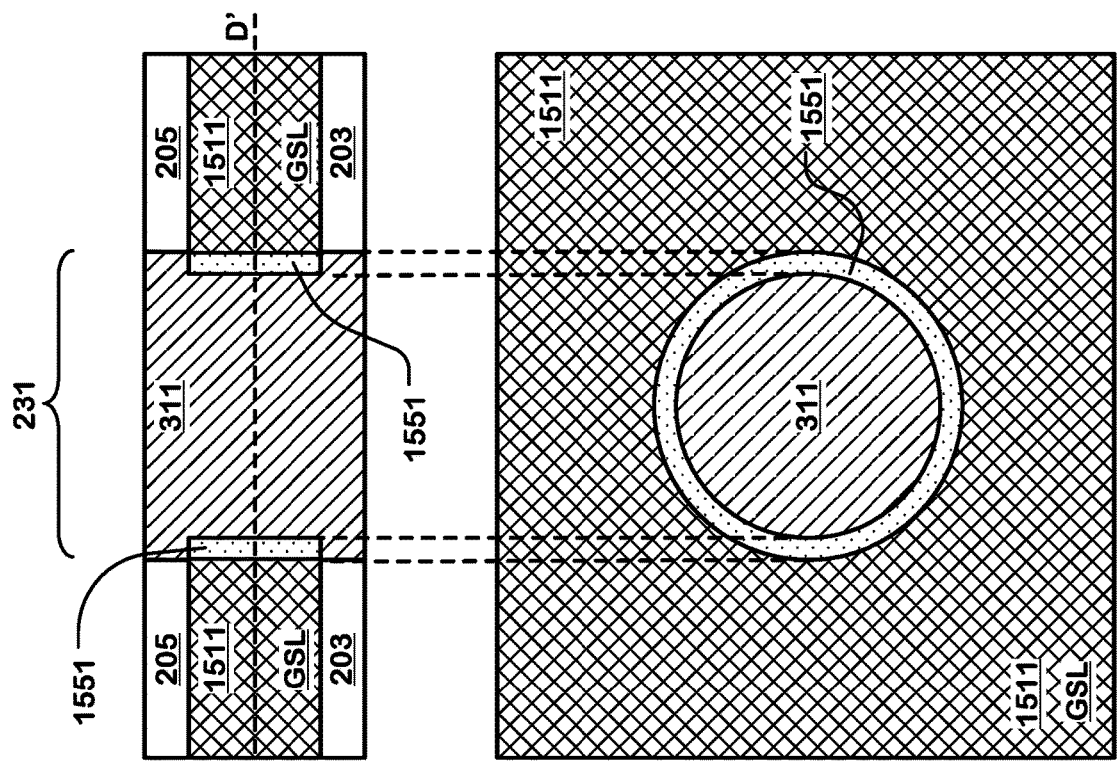
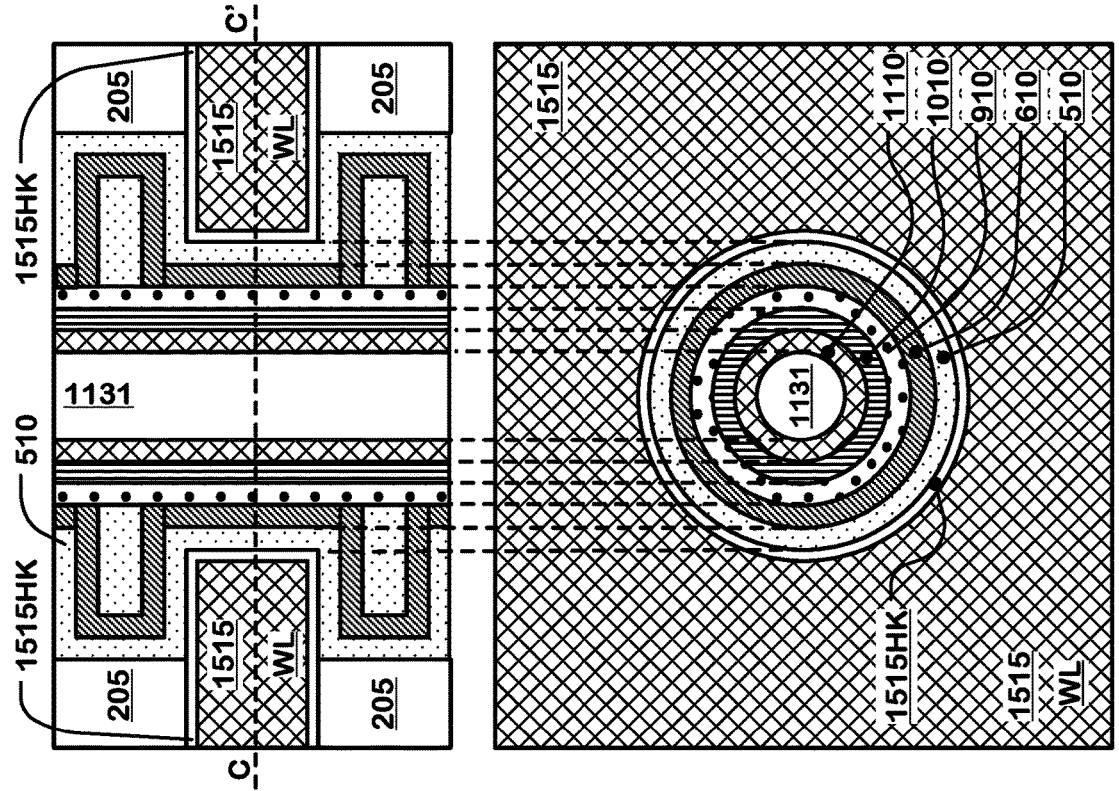
Fig. 1D
Fig. 1C

CRENELLATED CHARGE STORAGE STRUCTURES FOR 3D NAND

BACKGROUND

Field

The present invention relates to high density memory devices, and particularly to memory devices in which multiple planes of memory cells are arranged to provide a three-dimensional 3D array.

Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit. For example, thin-film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006.

Three dimensionally stacked NAND flash memory with charge storage structures can have a lateral charge migration issue, where lateral charge migration can impact memory cell retention. Lateral charge migration can cause unwanted results in a negative shift of the threshold voltage (Vt) and a positive shift of the string read current immediately after programming. See Choi et al., "Comprehensive evaluation of early retention (fast charge loss within a few seconds) characteristics in tube-type 3-D NAND Flash Memory," IEEE 2016 Symposium on VLSI Technology Digest of Technical Papers.

It is desirable to provide technology for three-dimensional integrated circuit memory including charge storage structures with improved memory cell retention.

SUMMARY

A memory device is provided including concave charge storage structures on insulating layers, without increasing the thickness of the insulating layers or reducing the thickness of conductive layers separated by the insulating layers. The memory device can be manufactured with a self-aligned method without adding extra lithographic steps.

A memory device comprises a stack of conductive strips separated by insulating layers on a substrate, and a vertical channel structure disposed in a hole through the stack of conductive strips to the substrate. Charge storage structures are disposed at cross points of the conductive strips and the vertical channel structure, the charge storage structures including multiple layers of materials. The insulating layers having sidewalls are recessed from the vertical channel structure, a charge storage layer of the multiple layers of materials of the charge storage structures lining the sidewalls of the insulating layers. The sidewalls of the insulating layers surround the vertical channel structure and the tunneling layer. Dielectric material is disposed as a fill body or spacer between the vertical channel structure and the charge storage layer on sidewalls of the insulating layers.

The stack of conductive strips includes a top plane of conductive strips, a plurality of intermediate planes of conductive strips, and a bottom plane of conductive strips. A blocking layer and the charge storage layer of the multiple layers of materials of the charge storage structures are crenellated along sides of conductive strips in the plurality of intermediate planes and the sidewalls of the insulating layers. A tunneling layer of the multiple layers of materials of the charge storage structures is disposed over the charge storage layer and over the dielectric material.

The vertical channel structure can comprise a first channel film over a tunneling layer of the multiple layers of materials of the charge storage structure, and a second channel film over the first channel film. A pad can be connected to the second channel film at an upper end.

The memory device can comprise a crystalline semiconductor plug in the hole, the crystalline semiconductor plug disposed on and in contact with the substrate. The crystalline semiconductor plug has a top surface below the plurality of intermediate planes of conductive strips and above the bottom plane of conductive strips. The memory device can comprise an oxide on sides of the crystalline semiconductor plug, the oxide disposed between the crystalline semiconductor plug and conductive strips in the bottom plane of conductive strips. The second channel film in the vertical channel structure can be connected to the crystalline semiconductor plug.

In one embodiment, a layer of high-k material can be disposed between the crystalline semiconductor plug and conductive strips in the bottom plane of conductive strips. A layer of high-k material can be disposed between the charge storage structures and conductive strips in the intermediate planes of conductive strips.

The memory device can comprise a source line through the stack of conductive strips, the source line connected to the substrate and separated by spacers from conductive strips in the stack of conductive strips. The spacers can be connected to a bottom insulating layer separating a bottom plane of conductive strips in the stack of conductive strips from the substrate.

A method is also provided for manufacturing a memory device as described herein.

Other aspects and advantages of the present invention can be seen on review of the drawings, the detailed description and the claims, which follow.

BRIEF DESCRIPTION OF THE DRAWINGS

FIGS. 1A-1F are simplified horizontal cross-sectional diagrams of a 3D GAA VC NAND memory device.

FIGS. 4 to 9 illustrate forming charge storage structures including a charge storage layer on recessed sidewalls of insulating layers.

FIGS. 10 and 11 illustrate forming a vertical channel structure.

FIGS. 12-15 illustrate stages in the process for replacing the sacrificial layers in the stack with a conductive material.

FIGS. 16-17 illustrate stages in the process flow for forming a source line through the stack of conductive strips.

DETAILED DESCRIPTION

Figure 1:
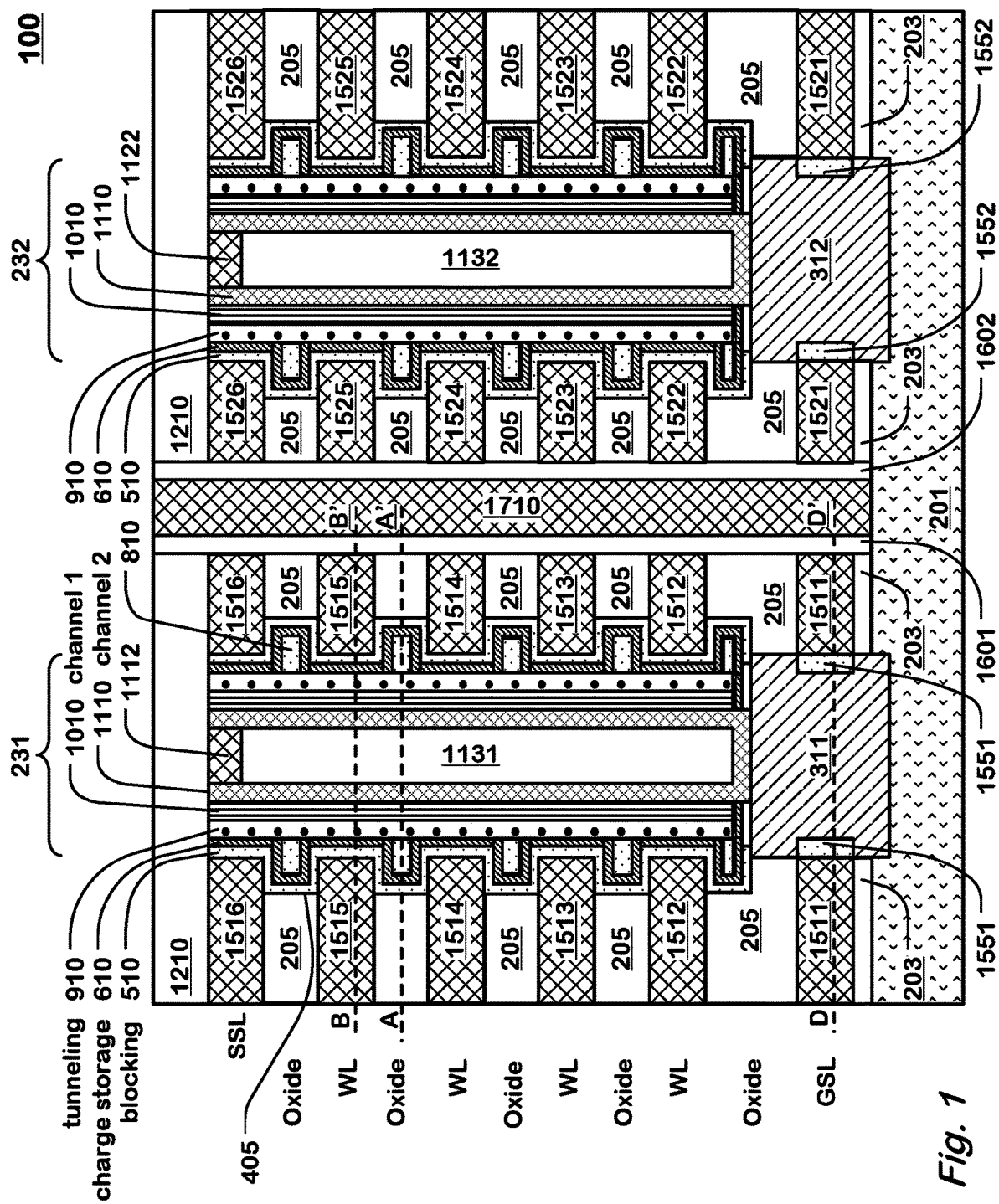
FIG. 1 is a simplified vertical cross-sectional diagram of a 3D GAA VC NAND memory device, illustrating charge storage structures on recessed sidewalls of insulating layers.

A detailed description of embodiments of the present invention is provided with reference to the Figures. It is to be understood that there is no intention to limit the technology to the specifically disclosed structural embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows. Like elements in various embodiments are commonly referred to with like reference numerals.

FIG. 1 is a simplified vertical cross-sectional diagram of a 3D GAA (gate-all-around) VC (vertical channel) NAND memory device, illustrating charge storage structures on recessed sidewalls of insulating layers. As shown in the example of FIG. 1, a memory device 100 comprises a stack of conductive strips (1511-1516) separated by insulating layers 205 on a substrate 201. The stack of conductive strips includes a top plane of conductive strips (1516), a plurality of intermediate planes of conductive strips (1512-1515), and a bottom plane of conductive strips (1511).

A vertical channel structure is disposed in a hole 231 through the stack of conductive strips to the substrate. The vertical channel structure can comprise a first channel film 1010 and a second channel film 1110 over the first channel film.

Charge storage structures (510, 610, 910) are disposed at cross points of the conductive strips and the vertical channel structure, where the charge storage structures can include multiple layers of materials. The multiple layers of materials can include a blocking layer 510, a charge storage layer 610, and a tunneling layer 910. A first channel film 1010 in the vertical channel structure can be formed over a tunneling layer 910 of the multiple layers of materials of the charge storage structure.

The insulating layers 205 have sidewalls 405 recessed from the vertical channel structure, a charge storage layer 610 of the multiple layers of materials of the charge storage structures lining the sidewalls 405 of the insulating layers. The sidewalls 405 of the insulating layers 205 surround the vertical channel structure (1010, 1110) and the tunneling layer (910).

Dielectric material 810 is disposed as a fill body or spacer in the recess between the vertical channel structure and the charge storage layer on sidewalls of the insulating layers.

The blocking layer 510 and the charge storage layer 610 of the multiple layers of materials of the charge storage structures are crenellated along sides of conductive strips in the plurality of intermediate planes of conductive strips (1512-1515) and the sidewalls of the insulating layers.

A tunneling layer 910 of the multiple layers of materials of the charge storage structures is disposed over the charge storage layer 610 and over the dielectric material 810, through the top plane of conductive strips 1516 and the intermediate planes of conductive strips (1512-1515). In other embodiments, the tunneling layer 910 and the dielectric material 810 can be formed in one process step.

A pad 1112 is connected to the second channel film 1110 in the vertical channel structure at an upper end. The hole 231 is filled with insulating material 1131, and the pad 1112 is disposed over the insulating material 1131. The pad can include a conductive material, such as an N-type material. The pad can be used for bit line connection.

A crystalline semiconductor plug 311 is disposed in the hole 231, on and in contact with the substrate 201. The crystalline semiconductor plug can have a top surface below the plurality of intermediate planes of conductive strips (1512-1515) and above the bottom plane of conductive strips 1511. A crystalline semiconductor plug is crystalline for the purposes of this description, if it contains large single crystal elements such as occur using epitaxial growth from a substrate in a via of this sort. It may not be a single crystal, but will be crystalline as opposed to polycrystalline in which the grains are much smaller.

An oxide 1551 can be formed on sides of the crystalline semiconductor plug 311. The oxide can be disposed between the crystalline semiconductor plug 311 and conductive strips in the bottom plane of conductive strips 1511. The second channel film 1110 in the vertical channel structure can be connected to the crystalline semiconductor plug 311.

The substrate can be a silicon P-type substrate. The conductive strips in the stack can include titanium nitride (TiN), tungsten (W), a polysilicon material or other conductive material selected for compatibility with the charge storage structures. The insulating layers can comprise silicon dioxide deposited in a variety of ways as known in the art. Also, the insulating layers can comprise other insulating materials, and combinations of insulating materials. In this example, all of the insulating layers consist of the same material. In other examples, different materials can be used in different layers as suits a particular design goal.

The blocking layer 510 can include AlOx, HfOx, ZrOx. The charge storage layer 610 can include silicon nitride SiN. The tunneling layer 910 can include oxide (e.g. SiO2), SiON (silicon-oxide-nitride) or ONO (oxide-nitride-oxide). The first channel film 1010 and second channel film 1110 can include undoped channel poly silicon.

An insulating layer 1210 is disposed over the stack of sacrificial layers. A source line 1710 is disposed through the insulating layer 1210 and the stack of conductive strips. The source line 1710 can include titanium nitride (TiN), tungsten (W), polysilicon material or other conductive material. The source line 1710 is connected to the substrate 201, and separated by spacers (1601, 1602) from conductive strips in the stack of conductive strips. The spacers (1601, 1602) are connected to a bottom insulating layer 203 separating a bottom plane of conductive strips (1511, 1521) in the stack of conductive strips from the substrate 201.

The first-mentioned stack of conductive strips (1511-1516) is disposed on a first side of the source line 1710. A second stack of conductive strips (1521-1526) separated by insulating layers 205 on the substrate 201 is disposed on a second side of the source line 1710 opposite the first side. The second stack of conductive strips includes a top plane of conductive strips (1526), a plurality of intermediate planes of conductive strips (1522-1525), and a bottom plane of conductive strips (1521).

A second vertical channel structure is disposed in a second hole 232 through the second stack of conductive strips to the substrate, and can comprise a first channel film 1010 and a second channel film 1110 over the first channel film.

Charge storage structures, including the blocking layer 510, the charge storage layer 610, and the tunneling layer 910 in the second stack of conductive strips are as described for the first-mentioned stack of conductive strips.

A pad 1122 is connected to the second channel film 1110 in the second vertical channel structure at an upper end. The hole 232 is filled with insulating material 1132, and the pad 1122 is disposed over the insulating material 1132. The pad 1122 can be used for bit line connection.

A second crystalline semiconductor plug 312 is disposed in the second hole 232, on and in contact with the substrate 201. The crystalline semiconductor plug can have a top surface below the plurality of intermediate planes of conductive strips (1522-1525) and above the bottom plane of conductive strips 1521 in the second stack.

An oxide 1552 can be formed on sides of the second crystalline semiconductor plug 312. The second oxide can be disposed between the crystalline semiconductor plug 312 and conductive strips in the bottom plane of conductive strips 1521. The second channel film 1110 in the second vertical channel structure can be connected to the second crystalline semiconductor plug 312.

Figures 1A, 1B:
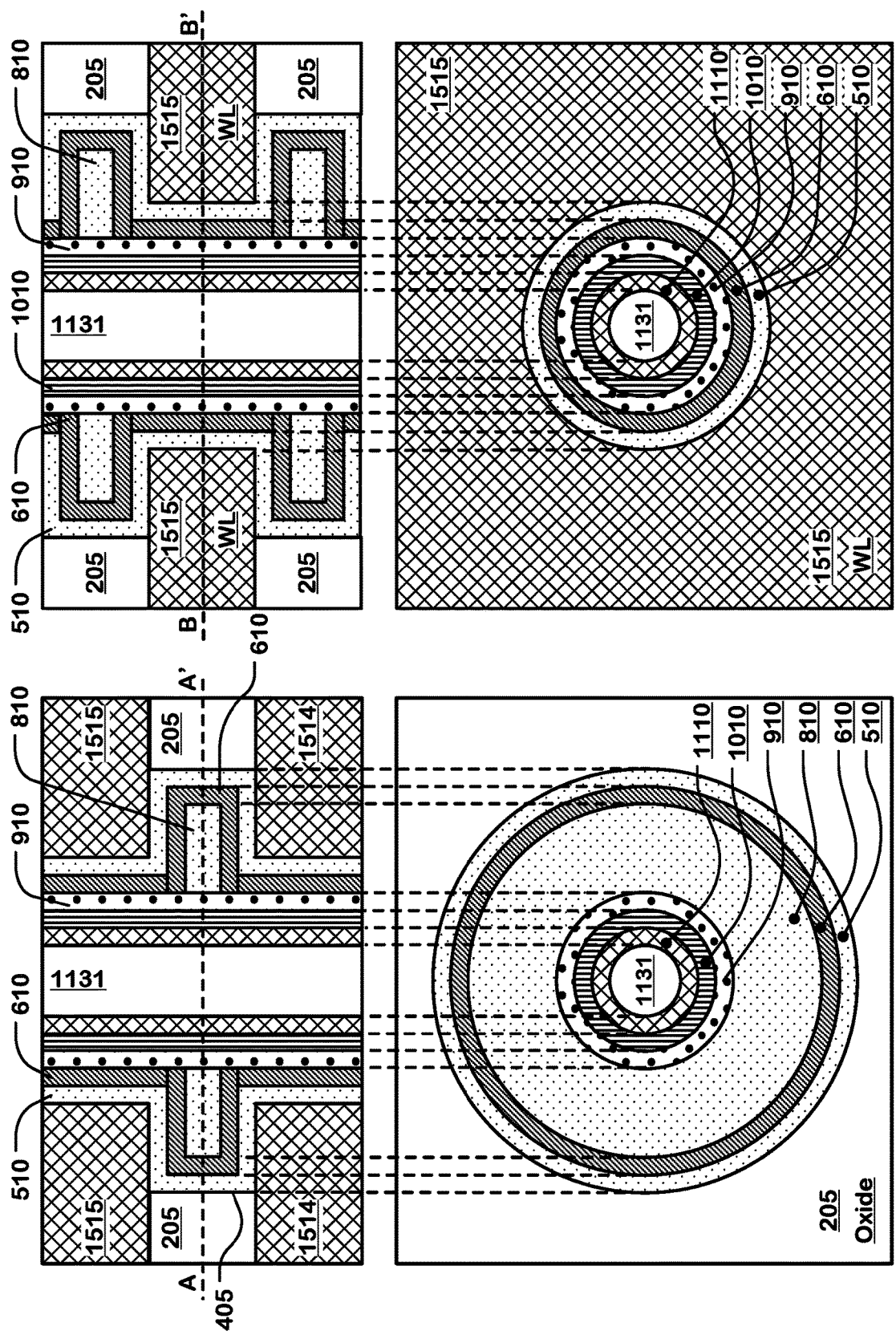

FIGS. 1A-1F are simplified horizontal cross-sectional diagrams of a 3D GAA VC NAND memory device. FIG. 1A is a horizontal cross-sectional diagram of the structure shown in FIG. 1 at a level of an insulating layer 205 in the stack, taken along a line A-A' as shown in FIGS. 1 and 1A. A vertical channel structure laterally surrounds insulating material 1131 in a hole 231 (FIG. 1) through the insulating layer 205. A vertical channel structure includes a first channel film 1010 and a second channel film 1110. A tunneling layer 910 of the multiple layers of materials of the charge storage structure laterally surrounds the vertical channel structure.

The insulating layer 205 is recessed from the vertical channel structure. A blocking layer 510 and a charge storage layer 610 of the multiple layers of materials of the charge storage structure line a sidewall 405 of the insulating layer 205.

Dielectric material 810 is disposed between the charge storage layer 610 and the tunneling layer 910, and laterally surrounds the tunneling layer 910. The charge storage layer 610 laterally surrounds the dielectric material 810.

FIG. 1B is a horizontal cross-sectional diagram of the structure shown in FIG. 1 at a level of a conductive layer 1515 in the plurality of intermediate planes of conductive strips in the stack, taken along a line B-B' as shown in FIGS. 1 and 1B. A vertical channel structure laterally surrounds insulating material 1131 in a hole 231 (FIG. 1) through the conductive layer 1515. A vertical channel structure includes a first channel film 1010 and a second channel film 1110. A tunneling layer 910 of the multiple layers of materials of the charge storage structure laterally surrounds the vertical channel structure. A charge storage layer 610 of the multiple layers of materials of the charge storage structure laterally surrounds and is in contact with the tunneling layer 910. A blocking layer 510 of the multiple layers of materials of the charge storage structure laterally surrounds and is in contact with the charge storage layer 610.

In this embodiment, dielectric material 810 as shown in FIG. 1A is not disposed on the charge storage layer 610 over sides of the conductive layers in the plurality of intermediate planes of conductive strips (1512-1515) in the stack. In other words, dielectric material 810 is not disposed between the vertical channel structure and the conductive strips in the plurality of intermediate planes of conductive strips (1512-1515). In other embodiments, the dielectric material 810 and the tunneling layer 910 can be formed in one process step using a same material, resulting in no interface between the dielectric material 810 and the tunneling layer 910.

FIG. 1C is a horizontal cross-sectional diagram of a structure like the structure shown in FIG. 1B at a level of a conductive layer 1515 in the plurality of intermediate planes of conductive strips in the stack, taken along a line C-C' as shown in FIG. 1C. Like elements in FIGS. 1B and 1C are referred to with like reference numerals. Description about like elements in FIG. 1B is generally applicable to like elements in FIG. 1C and are not repeated for FIG. 1C.

One difference shown in FIG. 1C is a layer of high-k material 1515HK, disposed between the charge storage structures including the blocking layer 510 and conductive strips (e.g. 1515) in the intermediate planes of conductive strips in the stack.

FIG. 1D is a horizontal cross-sectional diagram of the structure shown in FIG. 1 at a level of the bottom plane of conductive strips 1511 in the stack, taken along a line D-D' as shown in FIGS. 1 and 1D. A crystalline semiconductor plug 311 is disposed through the hole 231 at a level of the bottom plane of conductive strips 1511 in the stack. An oxide 1551 is formed on a side of the crystalline semiconductor plug 311, the oxide disposed between the crystalline semiconductor plug 311 and conductive strips in the bottom plane of conductive strips 1511.

Figure 1F:
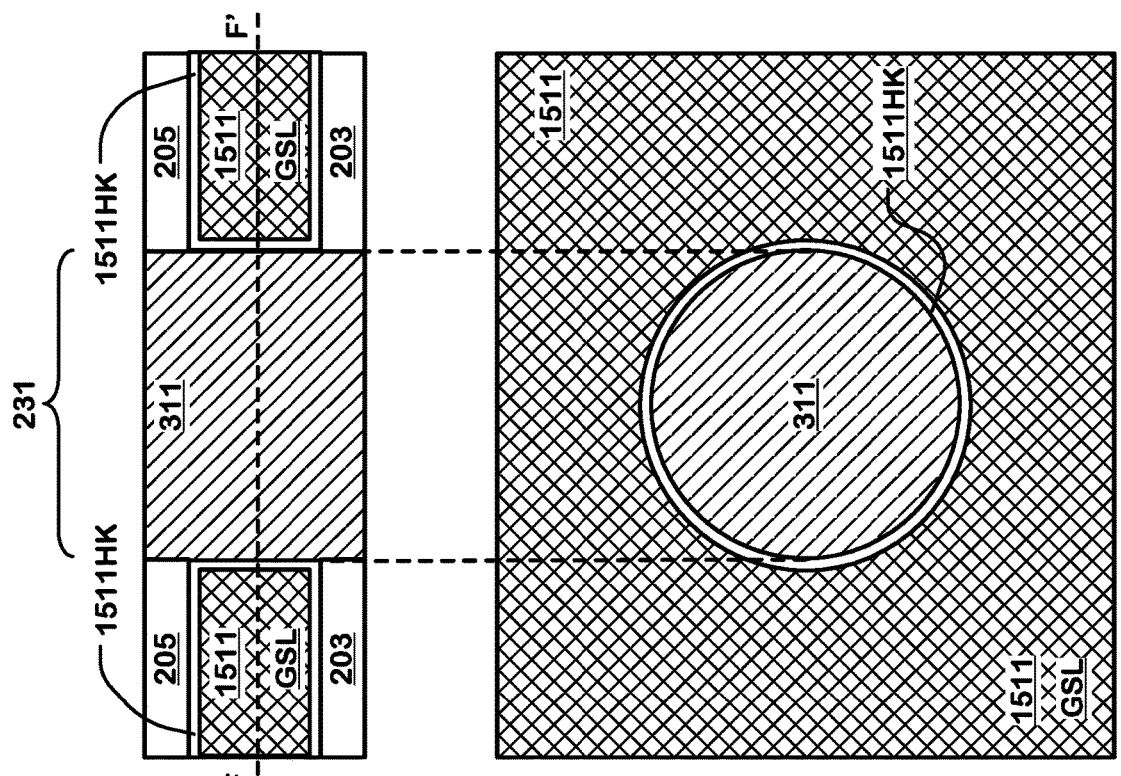
Figure 1E:
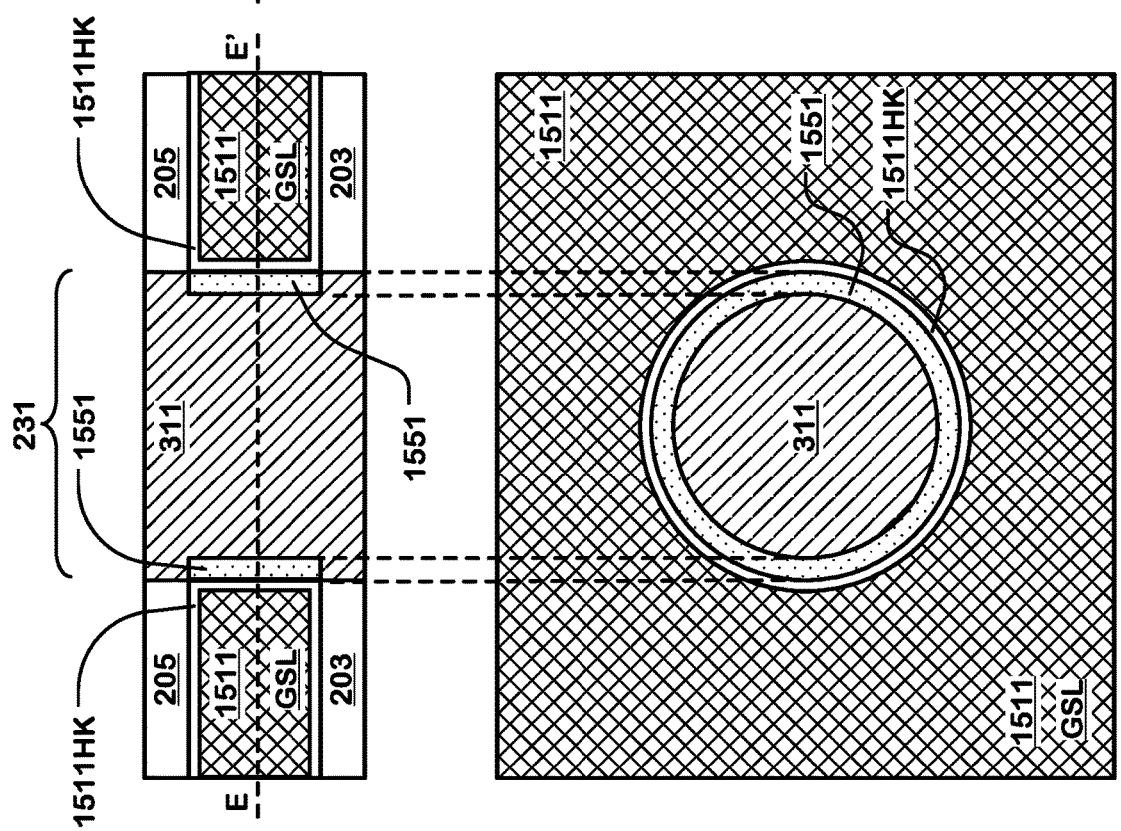

FIG. 1E is a horizontal cross-sectional diagram of a structure like the structure shown in FIG. 1D at a level of the bottom plane of conductive strips 1511 in the stack, taken along a line E-E' as shown in FIG. 1E. A crystalline semiconductor plug 311 is disposed through the hole 231 at a level of the bottom plane of conductive strips 1511 in the stack. An oxide 1551 is formed on a side of the crystalline semiconductor plug 311, the oxide disposed between the crystalline semiconductor plug 311 and conductive strips in the bottom plane of conductive strips 1511.

Like elements in FIGS. 1D and 1E are referred to with like reference numerals. Description about like elements in FIG. 1D is generally applicable to like elements in FIG. 1E and are not repeated for FIG. 1E.

One difference shown in FIG. 1E is a layer of high-k material 1511HK, disposed between an oxide 1551 formed on a side of the crystalline semiconductor plug 311 and conductive strips (e.g. 1511) in the bottom plane of conductive strips in the stack.

FIG. 1F is a horizontal cross-sectional diagram of a structure like the structure shown in FIG. 1E at a level of the bottom plane of conductive strips 1511 in the stack, taken along a line F-F' as shown in FIG. 1F. A crystalline semiconductor plug 311 is disposed through the hole 231 at a level of the bottom plane of conductive strips 1511 in the stack.

Like elements in FIGS. 1E and 1F are referred to with like reference numerals. Description about like elements in FIG. 1E is generally applicable to like elements in FIG. 1F and are not repeated for FIG. 1F.

The structure shown in FIG. 1F does not have an oxide 1551 formed on a side of the crystalline semiconductor plug 311 as shown in FIG. 1E. A layer of high-k material 1511HK is disposed between and in contact with the crystalline semiconductor plug 311 and conductive strips (e.g. 1511) in the bottom plane of conductive strips in the stack.

FIGS. 2 through 17 illustrate an example process flow for a memory architecture including charge storage structures including a crenellated charge storage layer on recessed sidewalls of insulating layers.

Figure 2:
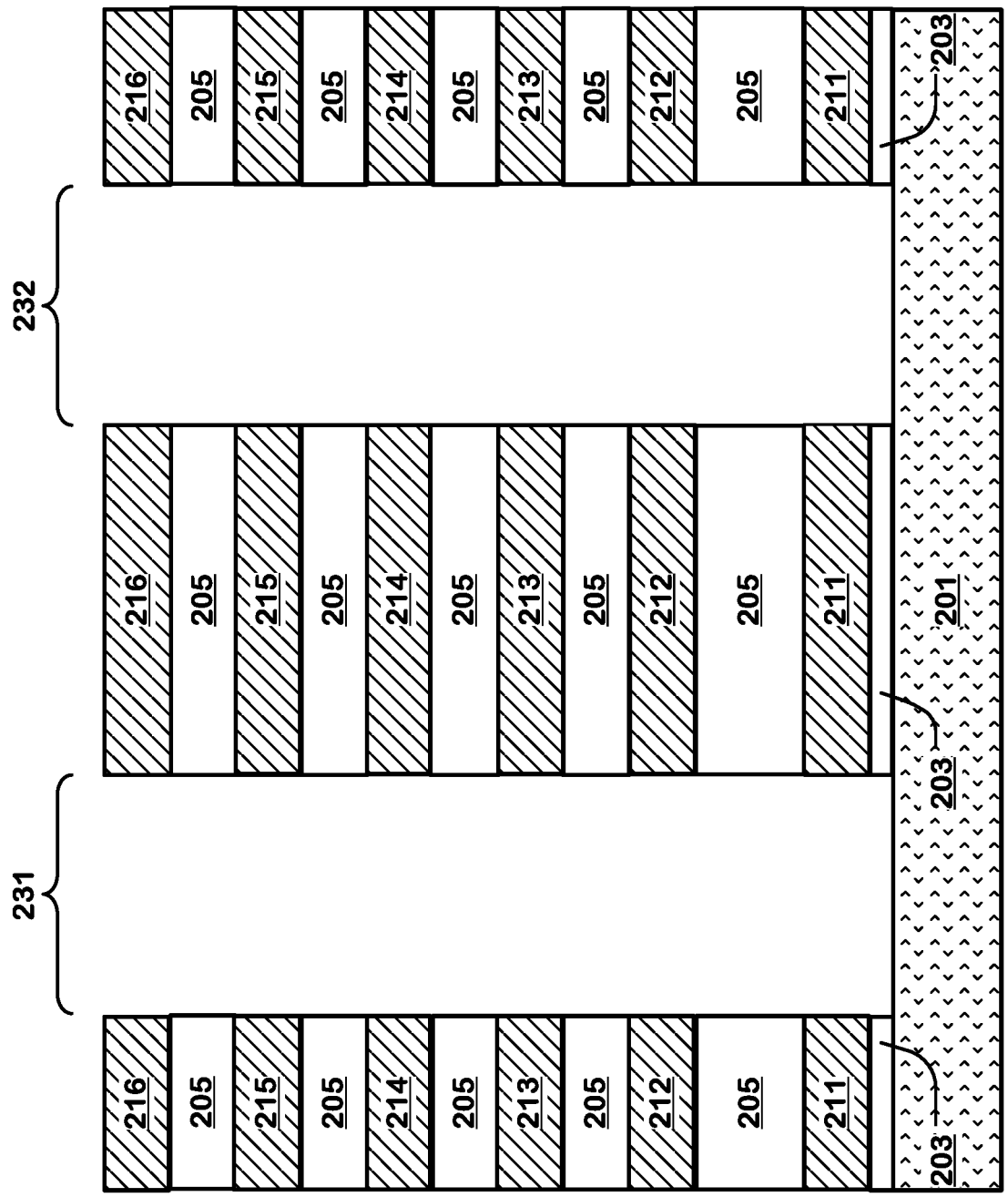
FIGS. 2 through 17 illustrate an example process flow for a memory architecture including charge storage structures including a crenellated charge storage layer on recessed sidewalls of insulating layers.

FIG. 2 illustrates a stage in the process flow after forming a stack of sacrificial layers (211-216) separated by insulating layers (205) on a substrate (201). The stack of sacrificial layers can include a top sacrificial layer (216), a plurality of intermediate sacrificial layers (212-215), and a bottom sacrificial layer (211). A bottom insulating layer (203) separates the bottom sacrificial layer (211) in the stack of sacrificial layers from the substrate (201). A hole (231) is formed through the stack of sacrificial layers to the substrate. Similarly, an array of holes, such as including the hole (231) and a second hole (232), can be formed through the stack of sacrificial layers to the substrate.

The sacrificial layers in the stack of sacrificial layers can include silicon nitride, and can be replaced later in the process with a conductive material to form a stack of conductive strips.

Figure 3:
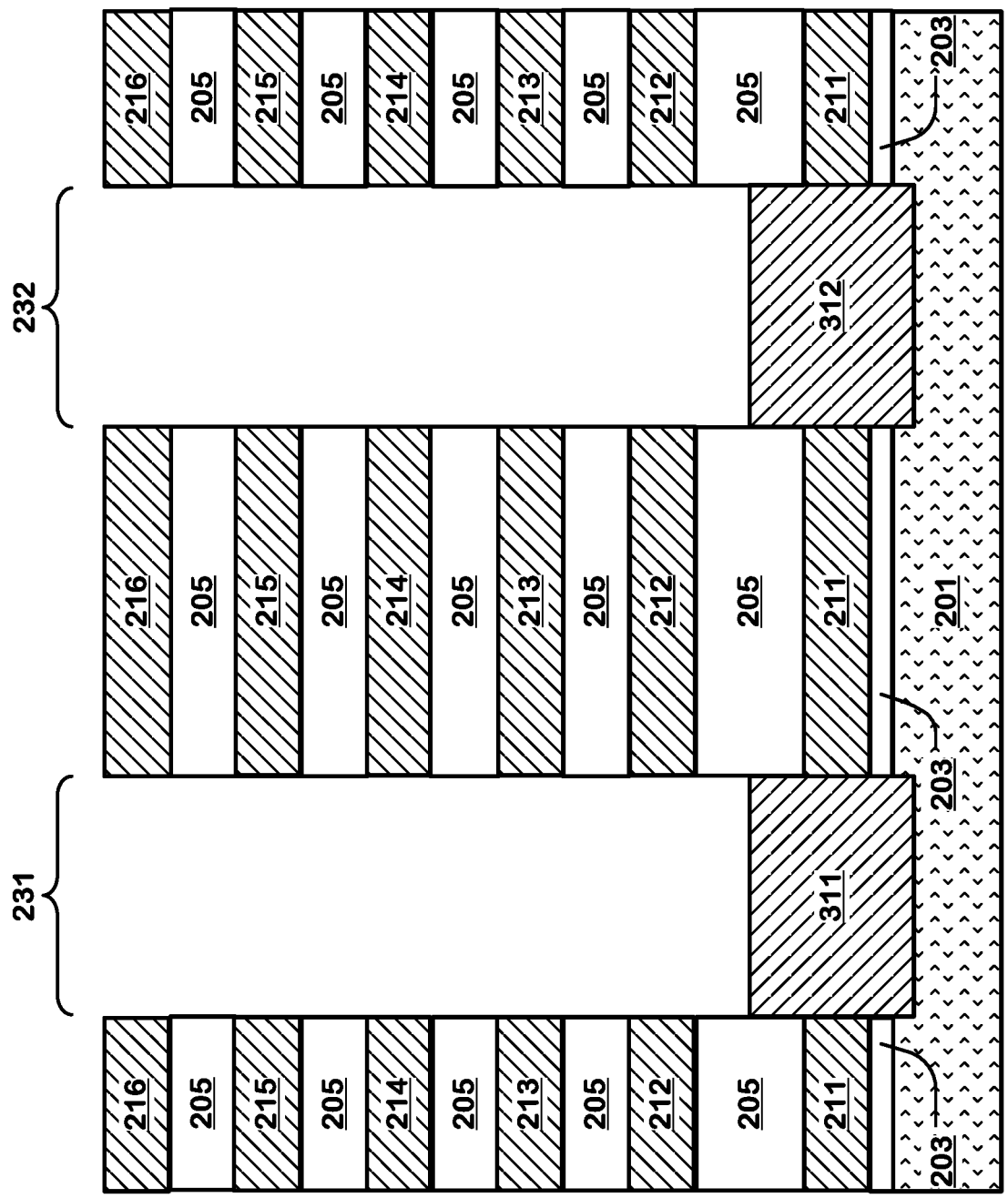

FIG. 3 illustrates a stage in the process flow after forming a crystalline semiconductor plug (311) in the hole (231). The crystalline semiconductor plug is disposed on and in contact with the substrate. The crystalline semiconductor plug can have a top surface below the plurality of intermediate sacrificial layers (212-215) and above the bottom sacrificial layer (211). Similarly, a second crystalline semiconductor plug (312) can be formed in the second hole (232). In one embodiment, a crystalline semiconductor plug can be formed by epitaxial growth from the substrate. A crystalline semiconductor plug can connect the substrate to a vertical channel structure in the hole, as further described in reference to FIG. 11.

FIGS. 4 to 9 illustrate forming charge storage structures including a charge storage layer on recessed sidewalls of insulating layers. The charge storage structures include multiple layers of materials, such as a blocking layer (510, FIG. 5), a charge storage layer (610, FIG. 6), and a tunneling layer (910, FIG. 9). A charge storage layer of the multiple layers of materials of the charge storage structures lines sidewalls (405, FIG. 4) of the insulating layers (205). The vertical channel structure is described in reference to FIGS. 10 and 11.

Figure 4:
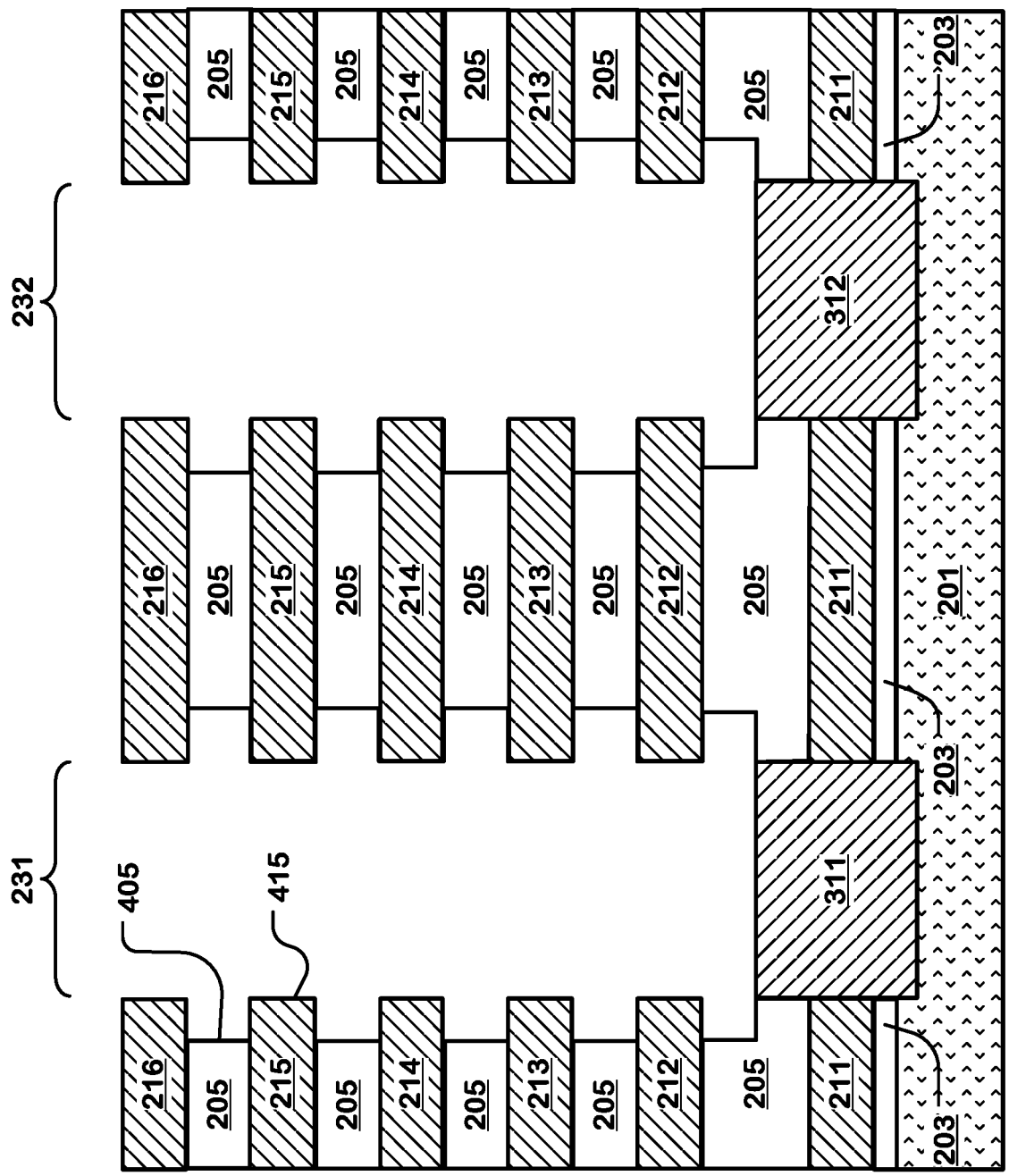

FIG. 4 illustrates a stage in the process flow after recessing the insulating layers from sides (415) of the sacrificial layers (e.g. 215) exposed by the hole (231). In one embodiment, the insulating layers can be recessed in a range between 20 nm to 100 nm, preferably by 30 nm. Wet or dry isotropical etch can be applied at this stage to recess the insulating layers, and keep the sacrificial layers almost intact. As a result of this recessing process, a crenellated surface is formed along sides of sacrificial strips in the top sacrificial layer (216) and the plurality of intermediate sacrificial layers (212-215), and the sidewalls (405) of the recessed insulating layers. In one embodiment, the crenellated surface is not extended to sides of sacrificial strips in the bottom sacrificial layer (211), as a crystalline semiconductor plug (311, 312) is disposed on the sides of sacrificial strips in the bottom sacrificial layer (211).

At later stages in the process described in reference to FIGS. 10 and 11, a vertical channel structure is formed in the hole (231), so the insulating layers are recessed from the vertical channel structure.

Figure 5:
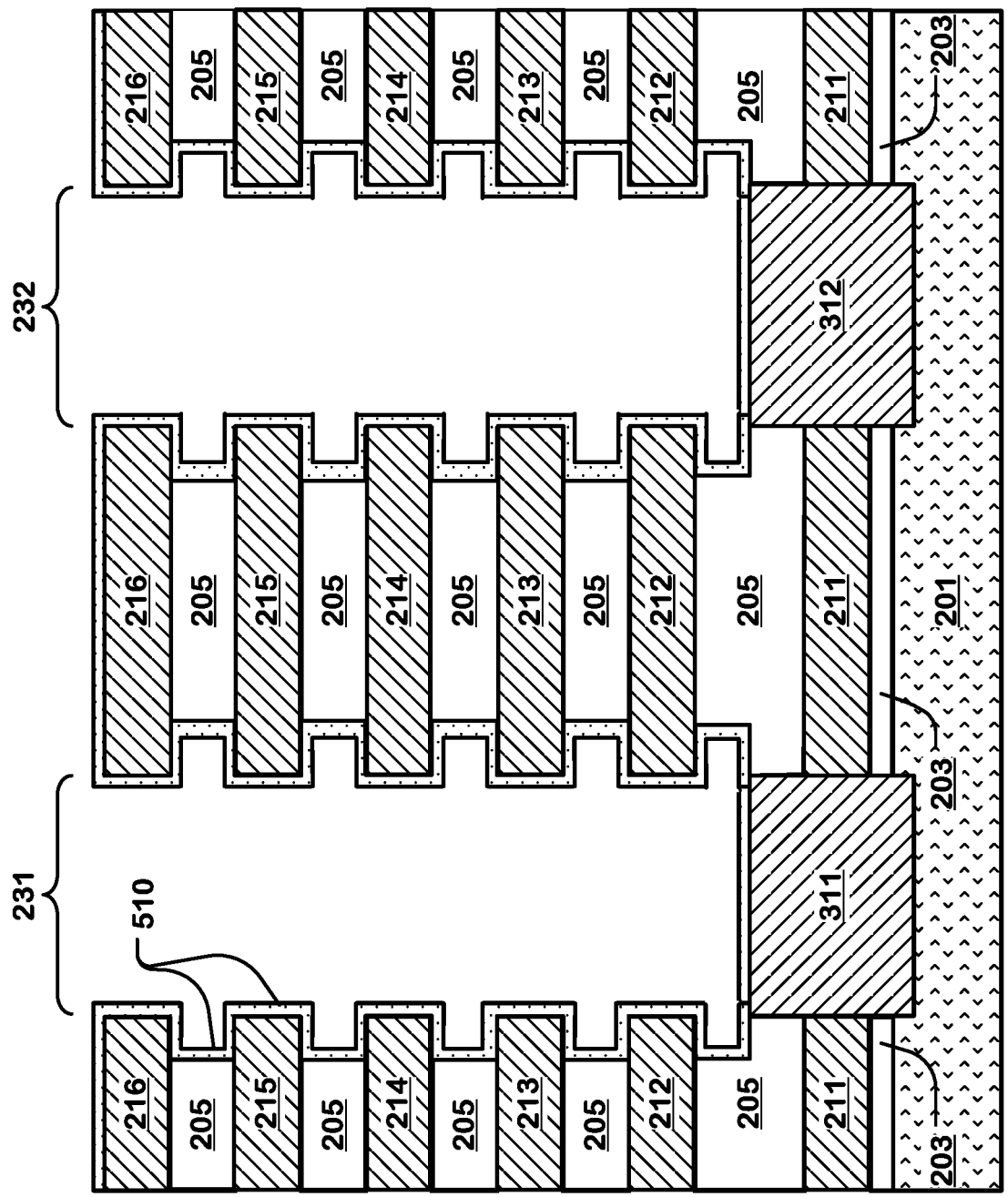

FIG. 5 illustrates a stage in the process flow after forming a blocking layer (510) of the multiple layers of materials of the charge storage structures, over the crenellated surface as described in reference to FIG. 4. As a result, the blocking layer (510) is crenellated along sides of sacrificial strips in the top sacrificial layer (216) and the plurality of intermediate sacrificial layers, and the sidewalls of the insulating layers. The blocking layer can also be formed over the crystalline semiconductor plug (e.g. 311) in the hole (e.g. 231). For instance, the blocking layer can include AlOx, HfOx, ZrOx, or other suitable dielectric materials.

Figure 6:
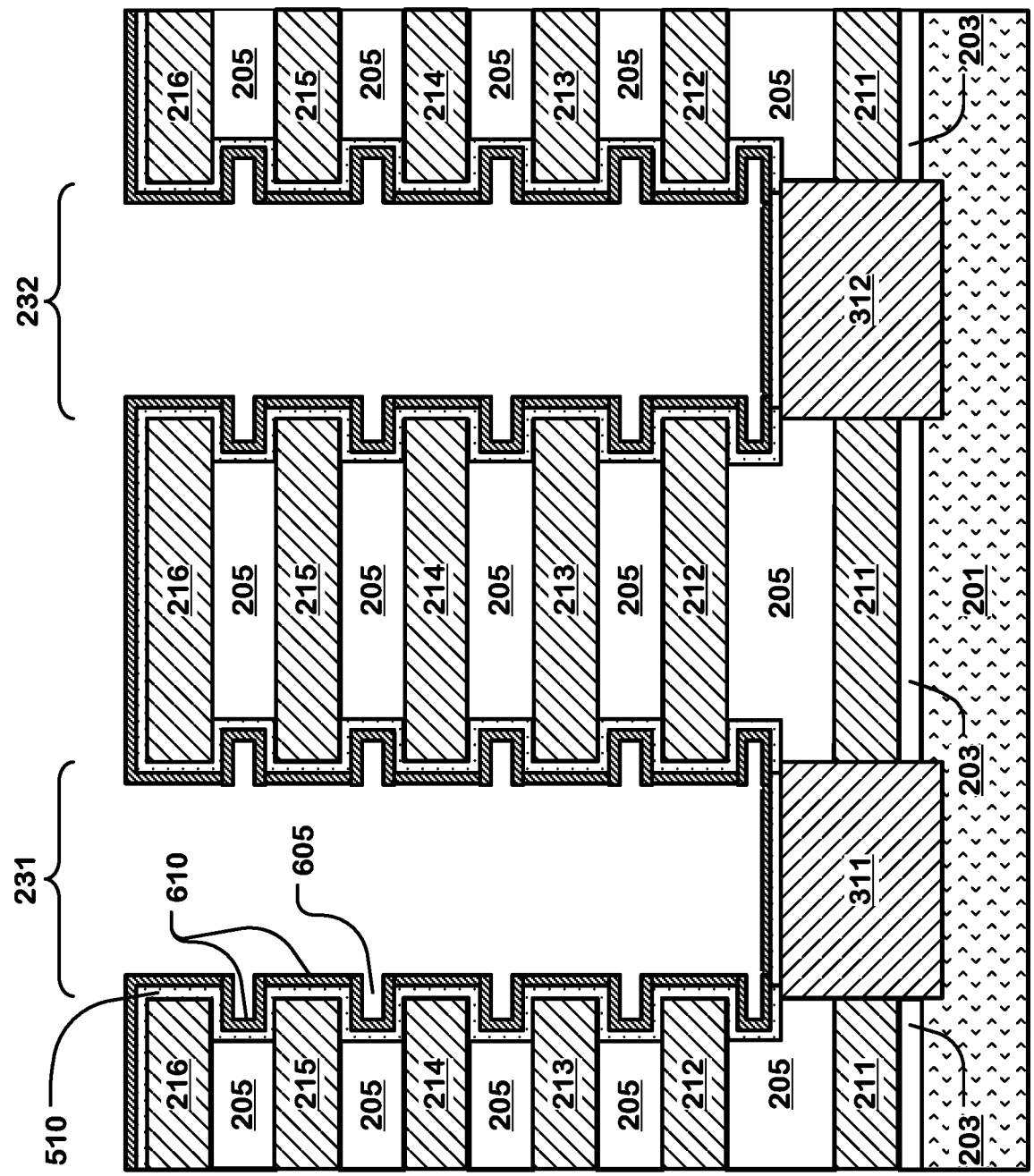

FIG. 6 illustrates a stage in the process flow after forming a charge storage layer (610) of the multiple layers of materials of the charge storage structures, over the blocking layer (510) as described in reference to FIG. 5. As a result, the charge storage layer (610) is crenellated along sides of sacrificial strips in the top sacrificial layer (216) and the plurality of intermediate sacrificial layers, and the sidewalls of the insulating layers. The crenellated charge storage layer (610) leaves recesses (605) on sidewalls of the insulating layers (205) between adjacent sacrificial layers (e.g. 214 and 215). The charge storage layer (610) can also be formed over the blocking layer over the crystalline semiconductor plug (e.g. 311) in the hole (e.g. 231). For instance, the charge storage layer can include silicon nitride (SiN) or silicon oxynitride (SiON).

Figure 7:
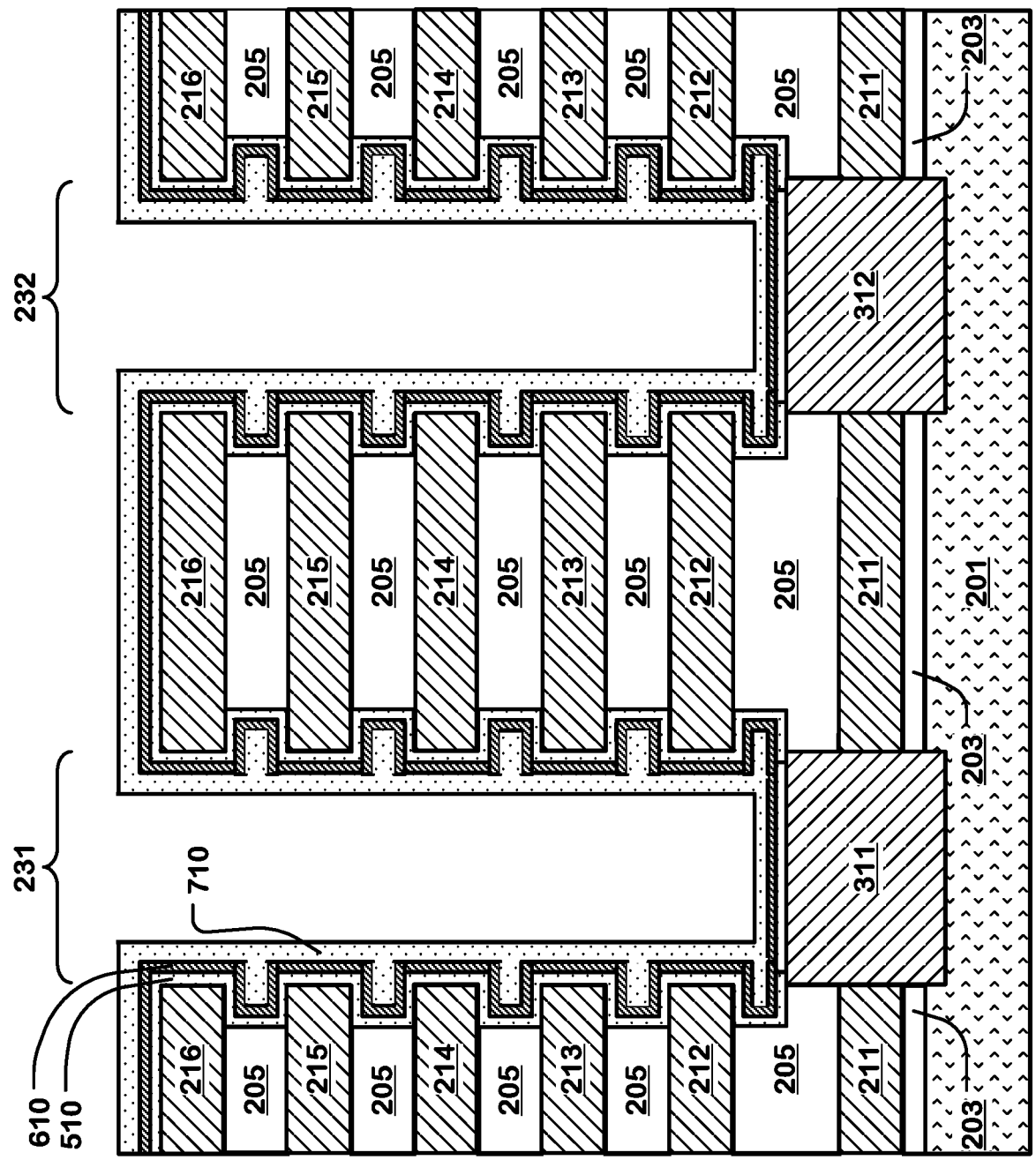

FIG. 7 illustrates a stage in the process flow after depositing dielectric material (710) over the charge storage layer (610). The dielectric material (710) fills the recesses (605, FIG. 6) on sidewalls of the insulating layers between adjacent sacrificial layers. The dielectric material (710) can also be deposited over the charge storage layer (610) over the blocking layer (510) over the crystalline semiconductor plug (e.g. 311) in the hole (e.g. 231).

Figure 8:
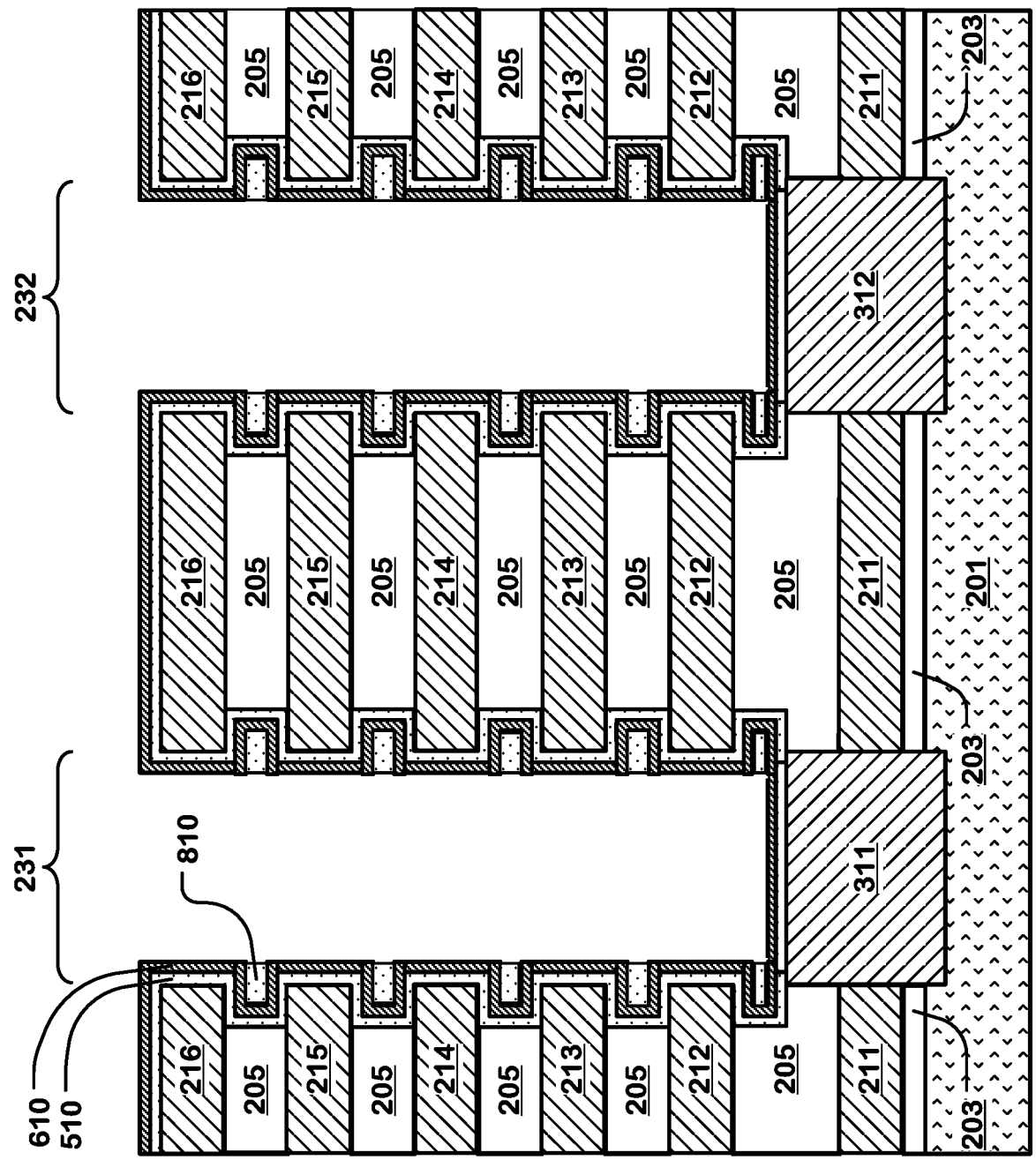

FIG. 8 illustrates a stage in the process flow after removing excessive dielectric material (710) in the hole (231). The excessive dielectric material can be on the charge storage layer (610) over sides of the sacrificial layers in the top sacrificial layer (216) and the plurality of intermediate sacrificial layers (212-215), and over the crystalline semiconductor plug (e.g. 311). At this stage, the dielectric material (810) remains in the recesses (605, FIG. 6) on sidewalls of the insulating layers (205) between adjacent sacrificial layers (e.g. 214 and 215) as a fill body or spacer. As a result, the dielectric material (810) is not disposed on the charge storage layer (610) over sides of the sacrificial layers in the top sacrificial layer (216) and the plurality of intermediate sacrificial layers. As a result, the fill bodies or spacers of the dielectric material (810) on sidewalls of the insulating layers (205) are vertically separated from each other.

Figure 9:
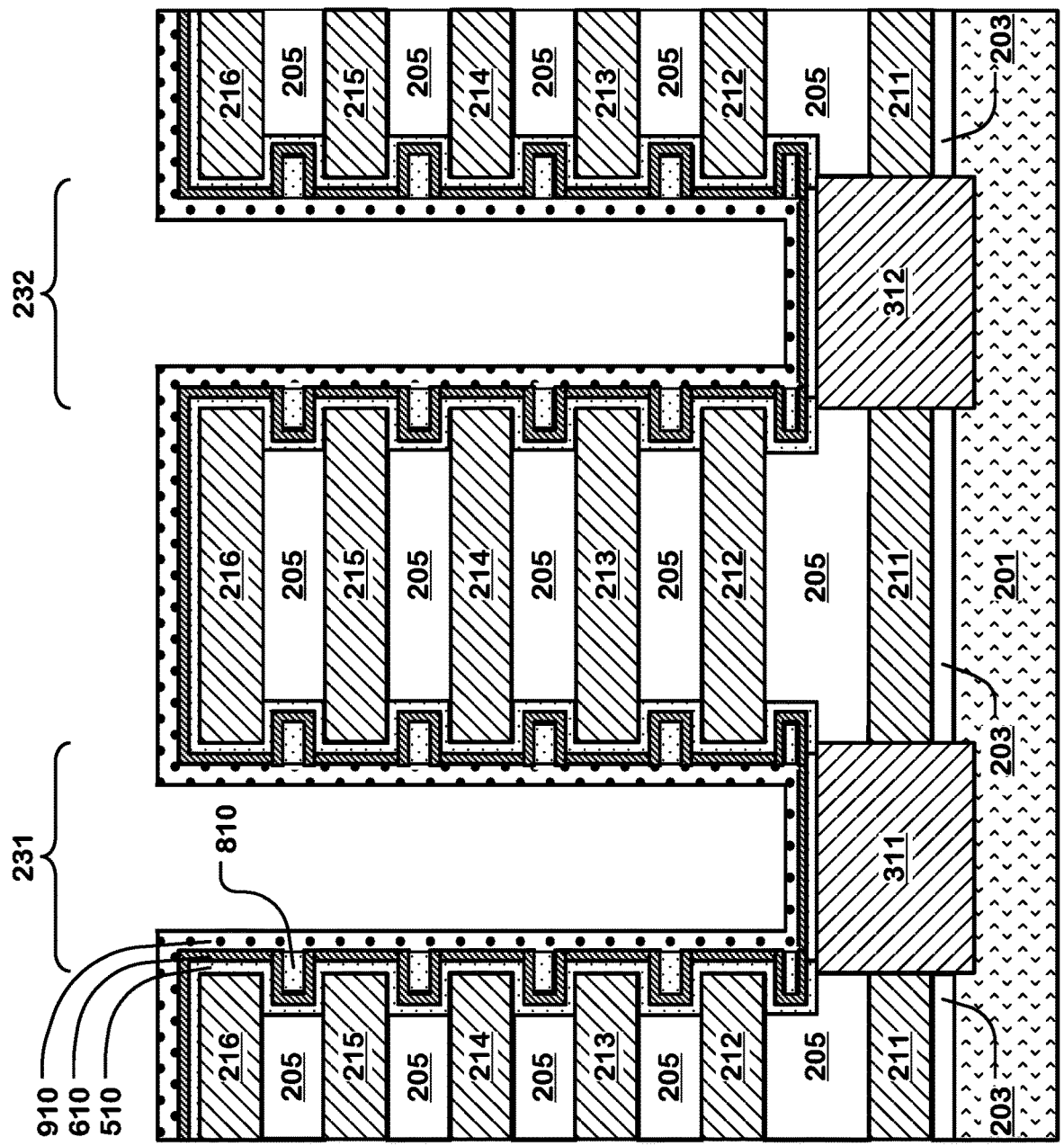

FIG. 9 illustrates a stage in the process flow after forming a tunneling layer (910) of the multiple layers of materials of the charge storage structures over the charge storage layer (610) and over the dielectric material (810). The tunneling layer (910) can also be formed over the charge storage layer (610) over the blocking layer (510) over the crystalline semiconductor plug (e.g. 311) in the hole (e.g. 231). For instance, the tunneling layer (910) can include oxide (e.g. SiO2), SiON (silicon-oxide-nitride) or ONO (oxide-nitride-oxide).). In other embodiments, the tunneling layer 910 and the dielectric material 810 can include a same material, and the tunneling layer 910 and the dielectric material 810 can be formed in one process step.

Figure 10:
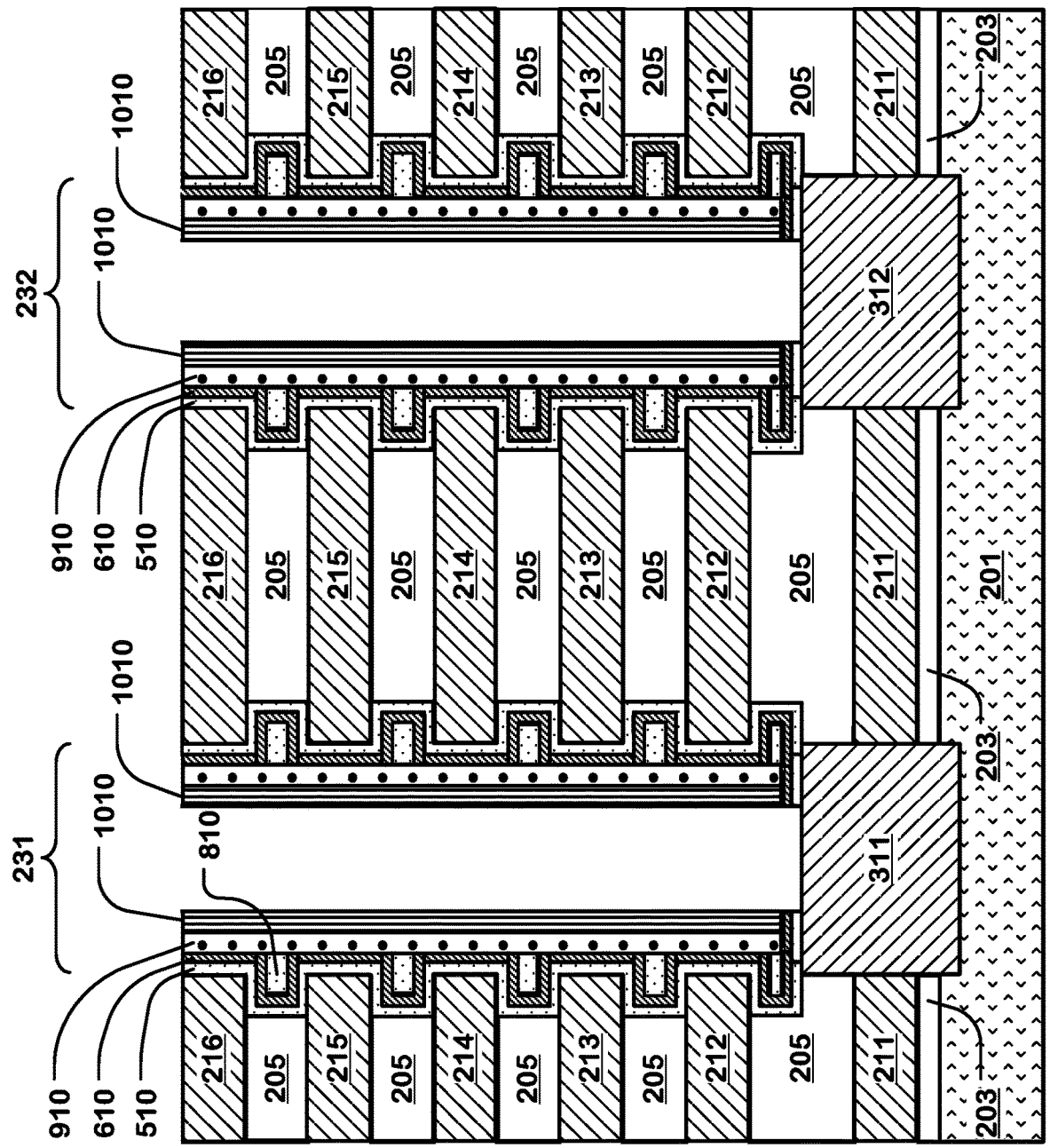
Figure 11:
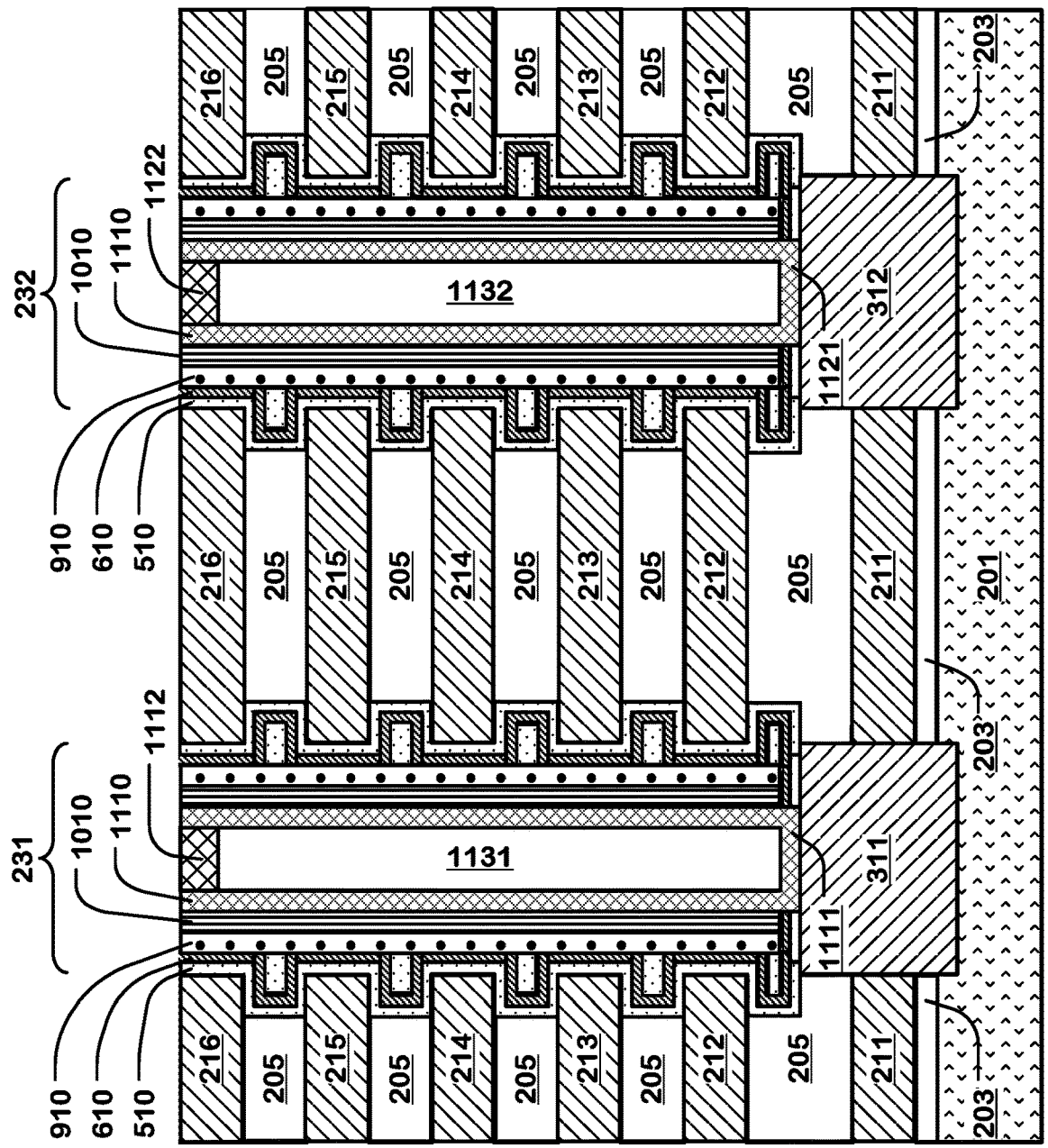

FIGS. 10 and 11 illustrate forming a vertical channel structure. FIG. 10 illustrates a stage in the process flow after forming a first channel film (1010) of the vertical channel structure over a tunneling layer (910) of the multiple layers of materials of the charge storage structure.

For instance, the first channel film (1010) can be formed by depositing undoped channel poly silicon. Similarly, at this stage, the first channel film (1010) can be deposited over the tunneling layer (910) of the multiple layers of materials of the charge storage structure in the second hole (232). At this stage, the first channel film (1010) can also be deposited over the tunneling layer (910, FIG. 9) over the crystalline semiconductor plug (e.g. 311) in the hole (231), and over the second crystalline semiconductor plug (e.g. 312) in the second hole (232).

This stage can then include etching the first channel film (1010) to expose the tunneling layer (910) over the crystalline semiconductor plug (311), and etching the tunneling layer (910), the charge storage layer (610), and the blocking layer (510) to expose the crystalline semiconductor plug. The etching steps at this stage can also remove the tunneling layer (910), the charge storage layer (610), and the blocking layer (510) on top of the stack of sacrificial layers.

FIG. 11 illustrates a stage in the process flow after depositing a second channel film (1110) over the first channel film (1010). The second channel film (1110) is connected to the crystalline semiconductor plug (311) in the hole 231 via a horizontal segment 1111 of the second channel film. For instance, the second channel film (1110) can be formed by depositing undoped channel poly silicon. The depositing process may leave excessive material on top of the stack of sacrificial layers. A CMP (chemical-mechanical planarization) process can be applied to the excessive material, stopping on the top sacrificial layer in the stack of sacrificial layers. At this stage, the second channel film (1110) can be deposited over the first channel film (1010) and connected to the crystalline semiconductor plug (312) in the second hole (232) via a horizontal segment 1112 of the second channel film.

This stage can then include forming a pad (1112) connected to the second channel film (1110). Forming a pad can include filling the hole 231 with insulating material (1131), recessing the insulating material in the hole to a level above a bottom surface of a top sacrificial layer (216) to form a recess, and forming a pad (1112) over the insulating material in the hole by filling the recess with a conductive material, such as an N-type material. The pad is connected to the second channel film (1110) at an upper end, and can be used for connection to bit lines. At this stage, a second pad (1122) can be formed connected to the second channel film (1110) in the second hole (232). The recess filling process may leave excessive material on top of the stack of sacrificial layers. A CMP (chemical-mechanical planarization) process can be applied to the material, stopping on the top sacrificial layer in the stack of sacrificial layers.

FIGS. 12-15 illustrate stages in the process for replacing the sacrificial layers in the stack with a conductive material.

Figure 12:
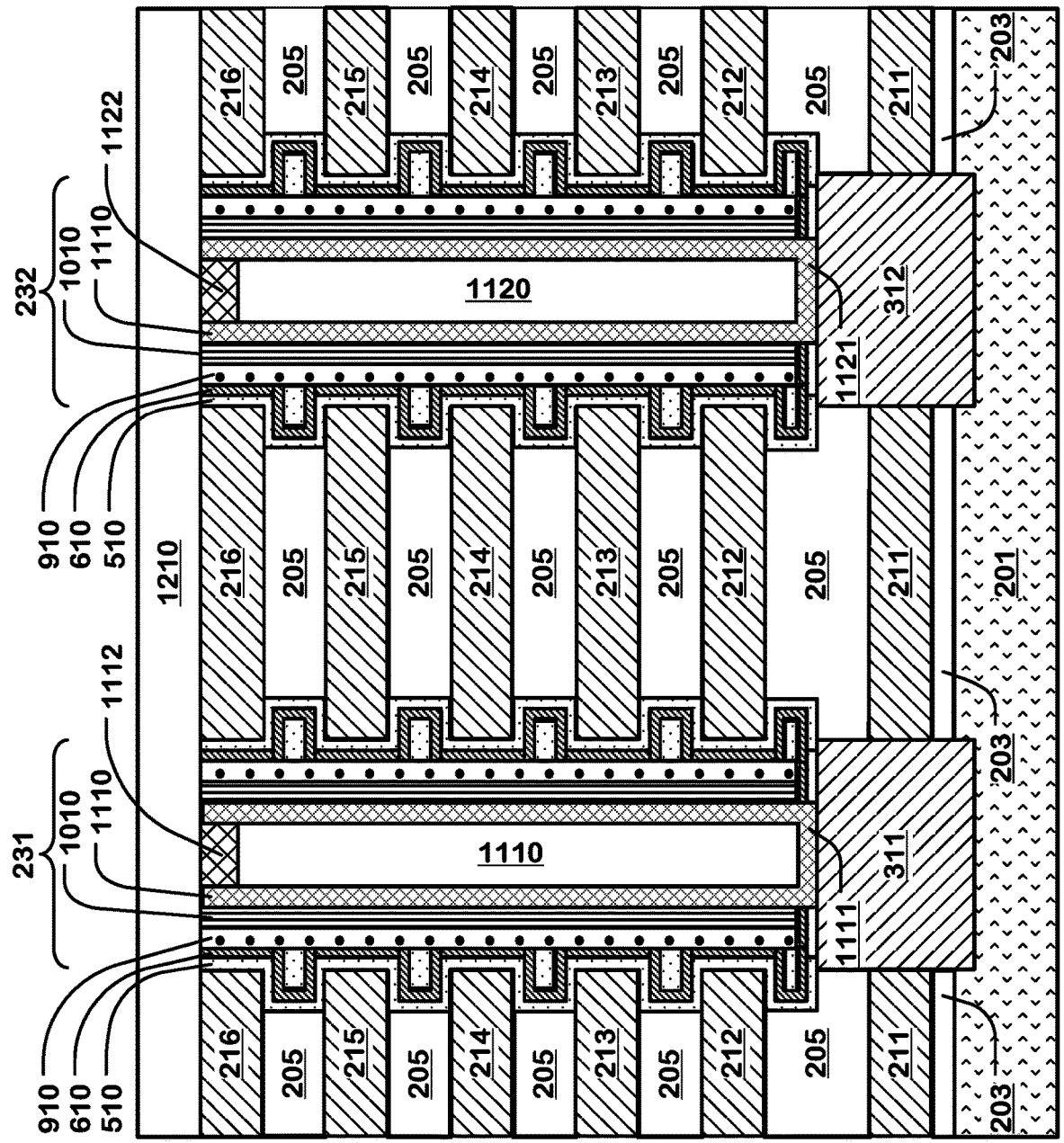

FIG. 12 illustrates a stage in the process flow after forming an insulating layer (1210) over the stack of sacrificial layers. The insulating layer (1210) is formed to protect top surfaces of the charge storage structures, the vertical channel structure and the pad (1112) during the subsequent stage in the process for etching a slit through the stack of sacrificial layers. As shown in the example of FIG. 12, the charge storage structures can include the blocking layer (510), the charge storage layer (610) and the tunneling layer (910), and the vertical channel structure can include the first channel film (1010) and the second channel film (1110).

Figure 13:
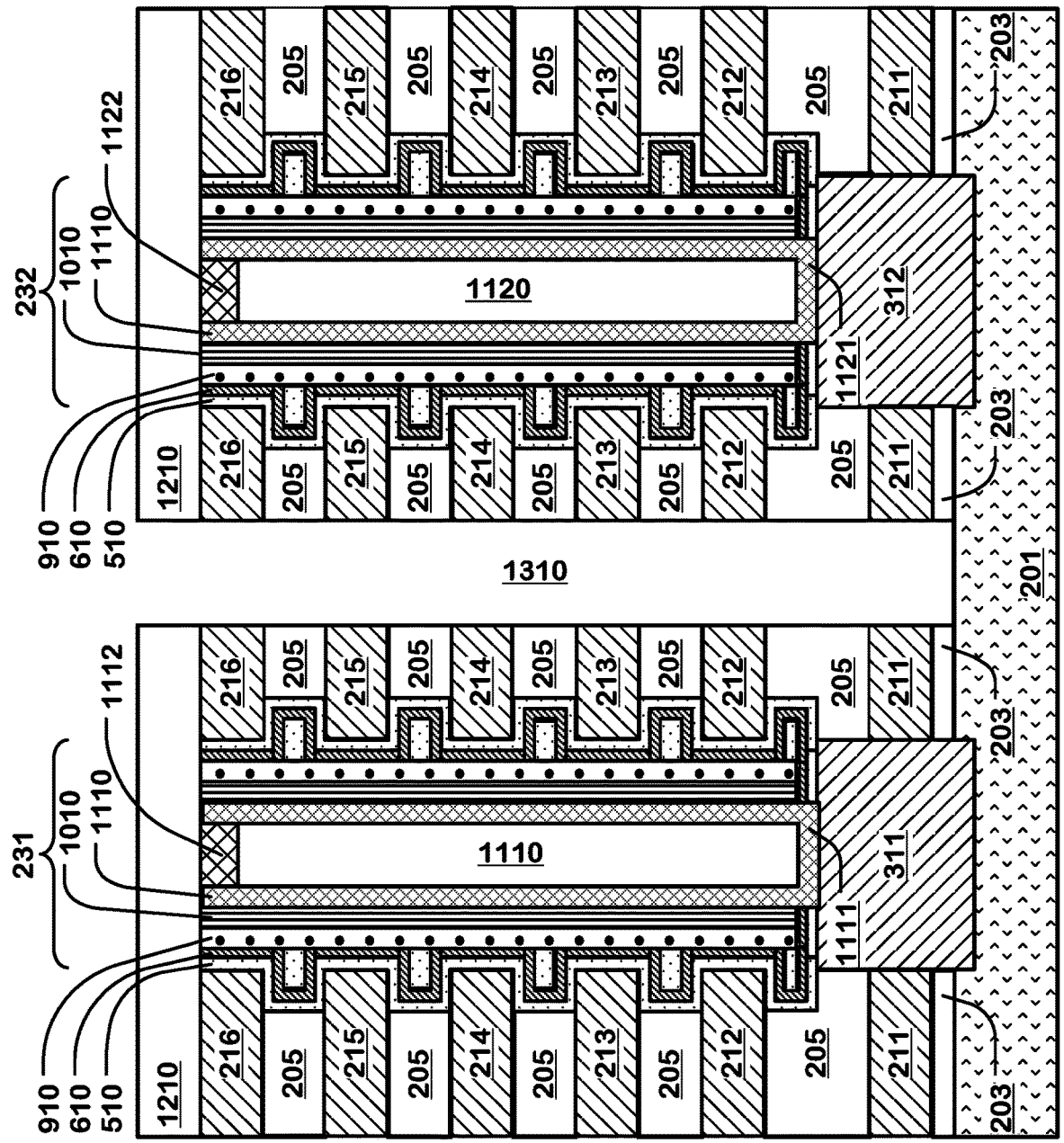

FIG. 13 illustrates a stage in the process flow after etching a slit (1310) through the insulating layer (1210) over the stack of sacrificial layers, and through the stack of sacrificial layers to the substrate. The slit exposes the sacrificial layers (211-216) in the stack.

Figure 14:
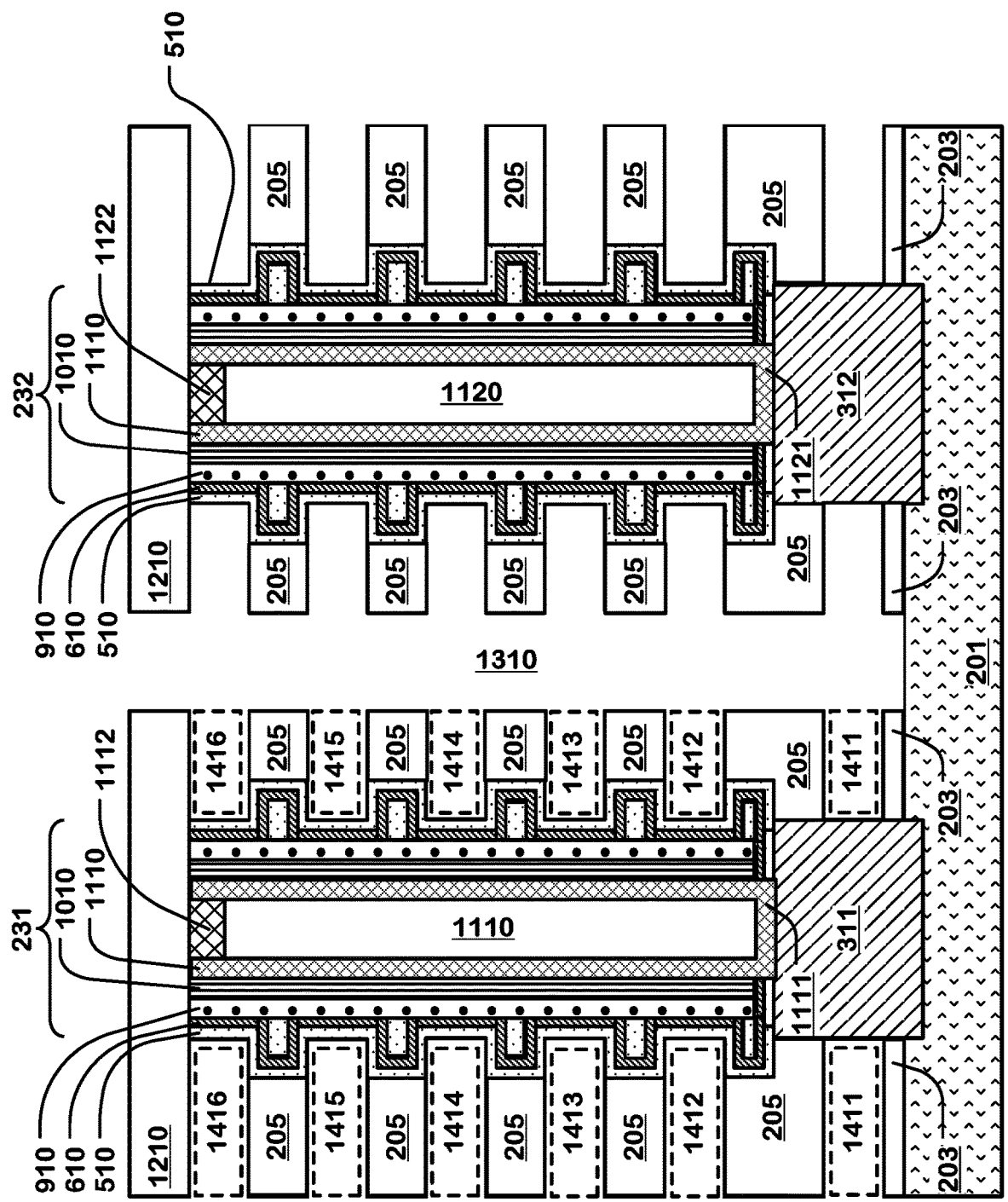

FIG. 14 illustrates a stage in the process flow after removing the sacrificial layers (211-216, FIG. 13) in the stack via the slit (1310) to form horizontal openings (1411-1416) between the insulating layers (1210, 205, 203). The horizontal openings (1411-1416) can include a top opening layer (1416), a plurality of intermediate opening layers (1412-1415), and a bottom opening layer (1411), corresponding to a top sacrificial layer (216, FIG. 13), a plurality of intermediate sacrificial layers (212-215, FIG. 13), and a bottom sacrificial layer (211, FIG. 13), respectively.

This stage in the process leaves the insulating layers (205) adhered to the charge storage structures including the blocking layer (510), with the horizontal openings in between. The plurality of sacrificial layers can be removed by an etching process using phosphoric acid (H3PO4) as an etchant. Phosphoric acid (H3PO4) is highly selective to the silicon nitride material used in the sacrificial layers, and to the oxide material used in the insulation layers.

For instance, the horizontal openings in the top opening layer (1416) can be used for forming string select lines (SSLs), the horizontal openings in the plurality of intermediate opening layers can be used for forming word lines (WLs), and the horizontal openings in the bottom opening layer can be used for forming ground select lines (GSLs).

Figure 15:
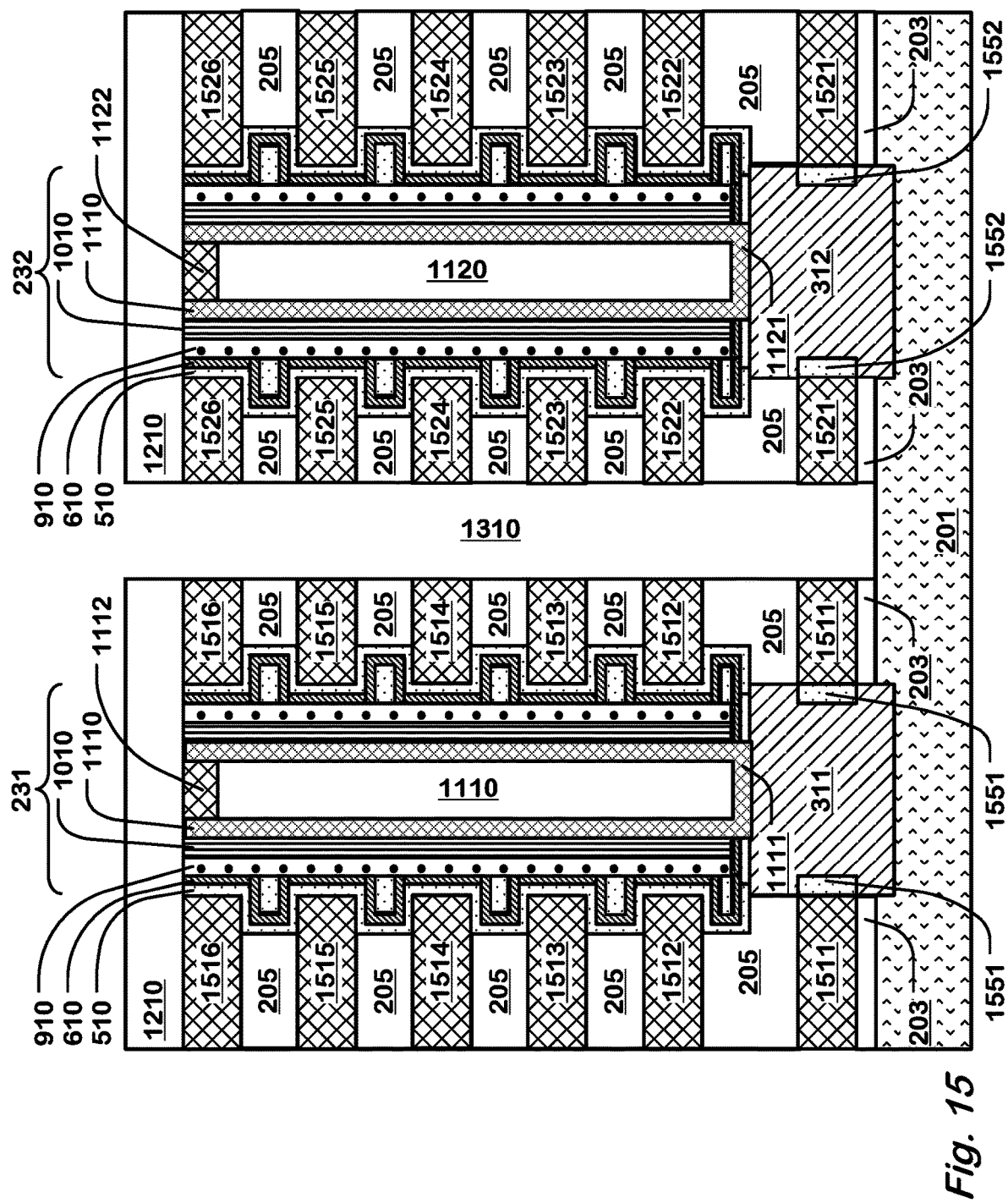

FIG. 15 illustrates a stage in the process flow after depositing a conductive material in the horizontal openings via the slit (1310) to form a stack of conductive strips (1511-1516), where the stack of conductive strips (1511-1516) is in contact with the charge storage structures in the hole (231). The conductive material can be titanium nitride (TiN), tungsten (W), a polysilicon material or other conductive material selected for compatibility with the charge storage structures. Similarly, at this stage in the process, the conductive material can be deposited in the horizontal openings via the same slit (1310) to form a second stack of conductive strips (1521-1526) in contact with the charge storage structures in the second hole (232).

The depositing process may leave excessive conductive material outside the horizontal openings. This stage can include removing the excessive conductive material outside the horizontal openings via the slit, to vertically separate the conductive material in adjacent conductive strips in the stack of conductive strips.

In one embodiment, an oxide (1551) can be formed on sides of the crystalline semiconductor plug (311) in the hole (231), before depositing the conductive material via the slit (1310). Similarly an oxide (1552) can be formed on sides of the crystalline semiconductor plug (312) in the second hole (232), before depositing the conductive material via the slit (1310).

The process flow can further include forming a layer of high-k material (1515HK, FIG. 1C) between the charge storage structures including the blocking layer (510, FIG. 1C) and conductive strips in the intermediate planes of conductive strips (1515, FIGS. 1C & 15). For instance, the layer of high-k material 1515HK can be formed in the horizontal openings (e.g. 1415, FIG. 14) at levels of the intermediate sacrificial layers, before a conductive material (e.g. 1515, FIG. 15) is deposited in the horizontal openings.

The process flow can further include forming a layer of high-k material (1511HK, FIG. 1E) between the crystalline semiconductor plug (311) and conductive strips in the bottom plane of conductive strips (1511, FIGS. 1E & 15). For instance, the layer of high-k material 1511HK can be formed in the horizontal openings (e.g. 1411, FIG. 14) at levels of the bottom sacrificial layer, before a conductive material (e.g. 1511, FIG. 15) is deposited in the horizontal openings. In this instance, an oxide 1551 can be formed on sides of the crystalline semiconductor plug (311). In another instance, no oxide is formed on sides of the crystalline semiconductor plug (311), as shown in FIG. 1F. In one embodiment, the layer of high-k material 1511HK in the horizontal openings at levels of the bottom sacrificial layer, and the layer of high-k material 1515HK between the charge storage structures including the blocking layer 510 and conductive strips (e.g. 1515, FIG. 1C) in the intermediate planes of conductive strips in the stack can be formed at a same process step.

Figure 16:
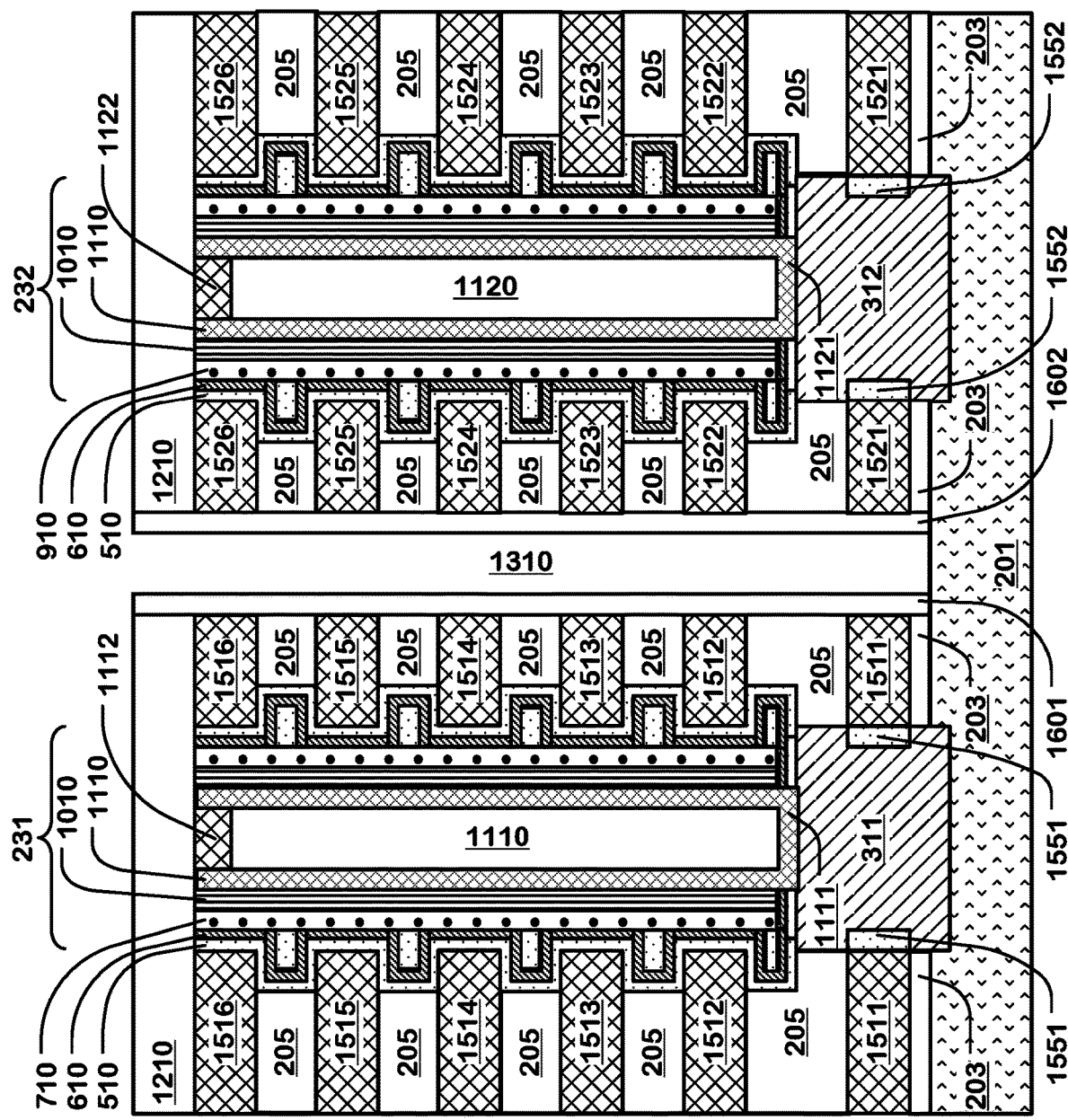
Figure 17:
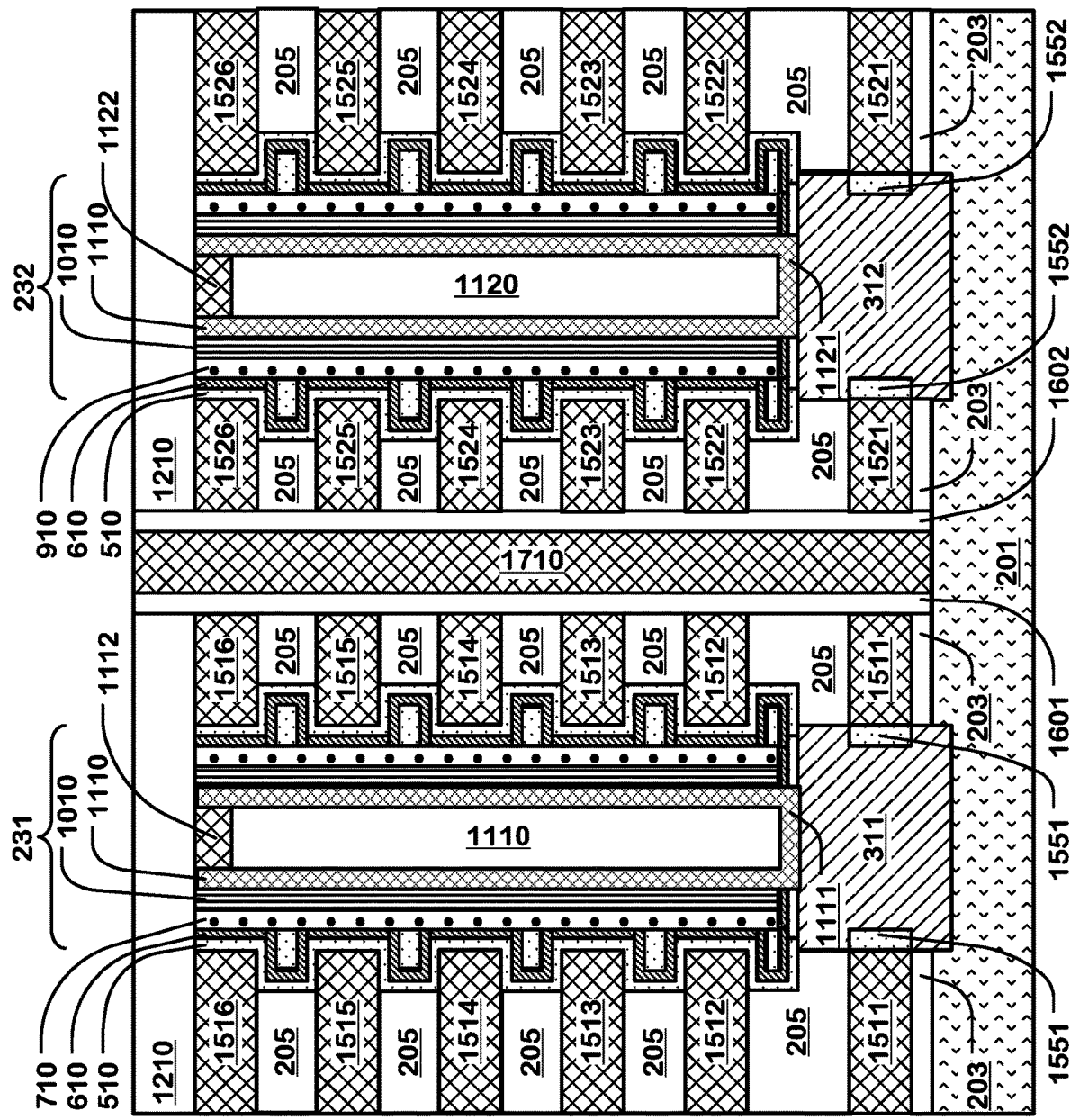

FIGS. 16-17 illustrate stages in the process flow for forming a source line through the stack of conductive strips. FIG. 16 illustrates a stage in the process flow after forming spacers (1601, 1602) on sides of conductive strips in the stack of conductive strips in the slit (1310). The spacers are connected to a bottom insulating layer (203) separating a bottom plane of conductive strips (1511, 1521) in the stack of conductive strips from the substrate (201).

FIG. 17 illustrates a stage in the process flow after forming a source line through the stack of conductive strips. A source line (1710) is connected to the substrate and separated by the spacers from the conductive strips in the stack of conductive strips. A source line can be formed by depositing a conductive material such as titanium nitride (TiN), tungsten (W), polysilicon material or other conductive materials, in the slit (1310). The depositing process may leave excessive conductive material over the insulating layer (1210) over the stack of conductive material. A CMP (chemical-mechanical planarization) process can be applied to remove the excessive conductive materials over the insulating layer (1210).

Figure 18:
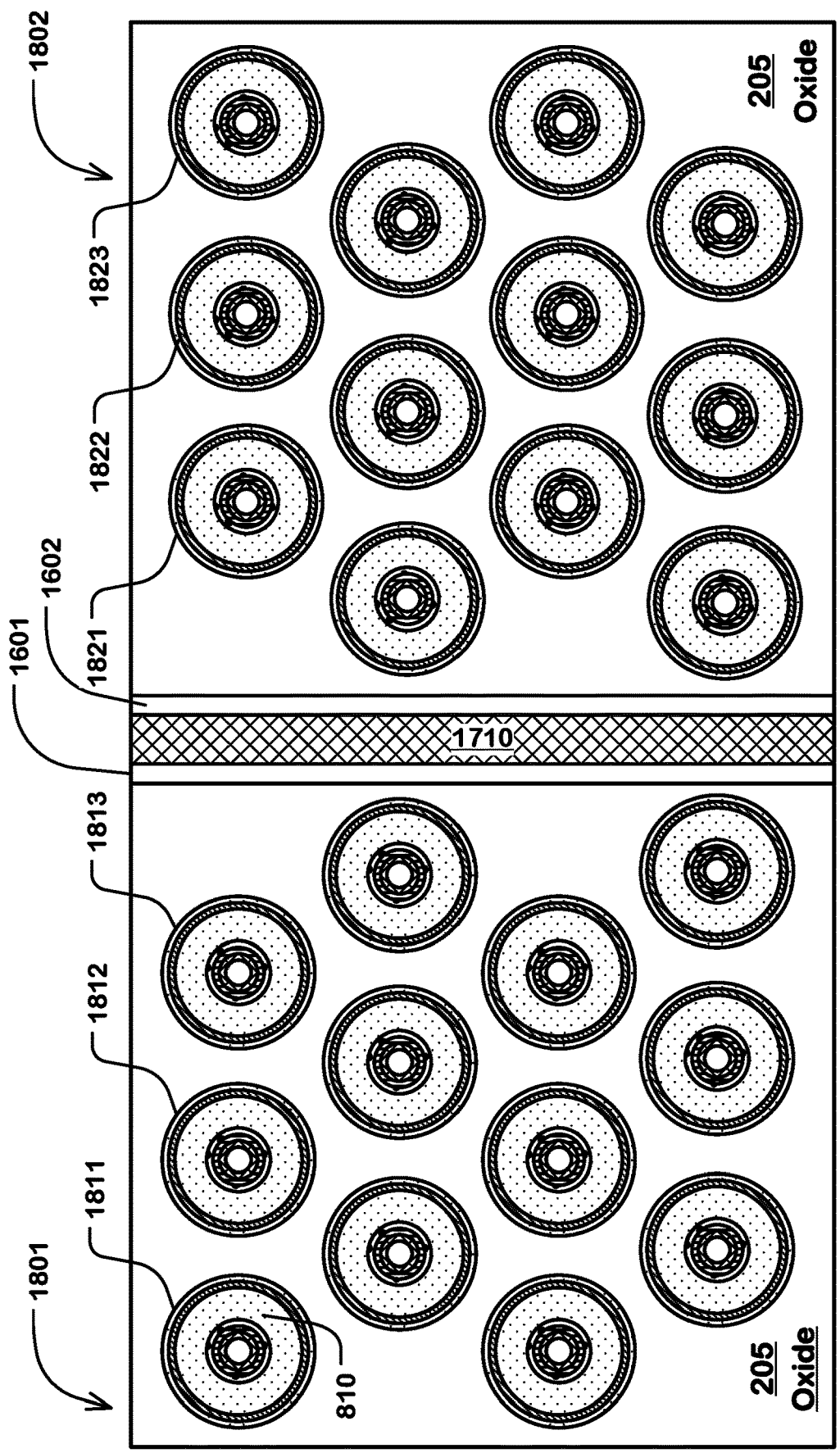
FIGS. 18-20 are simplified horizontal cross-sectional diagrams of a 3D memory device, at various levels of a stack of conductive strips separated by insulating layers.
Figure 19:
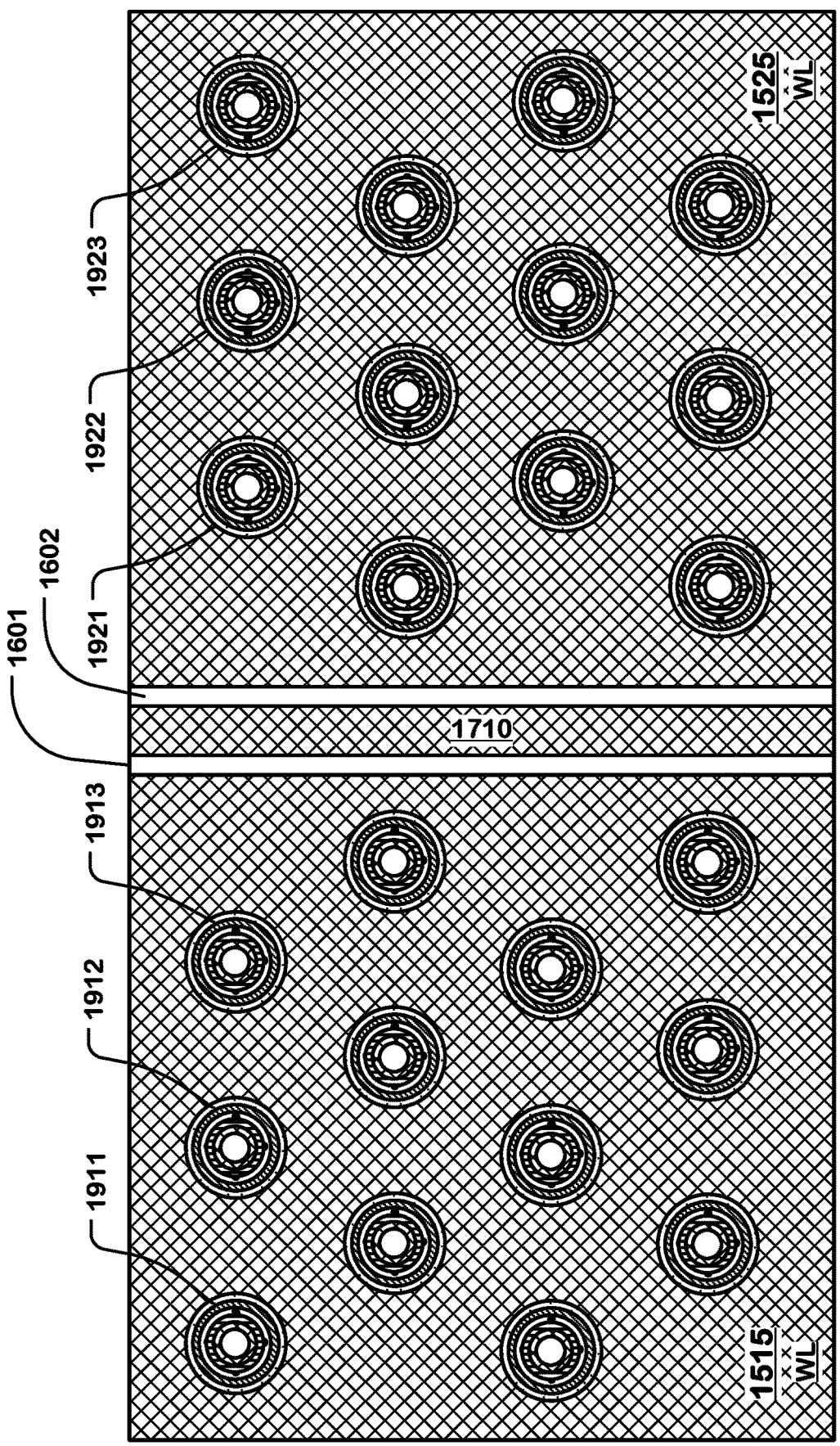
Figure 20:
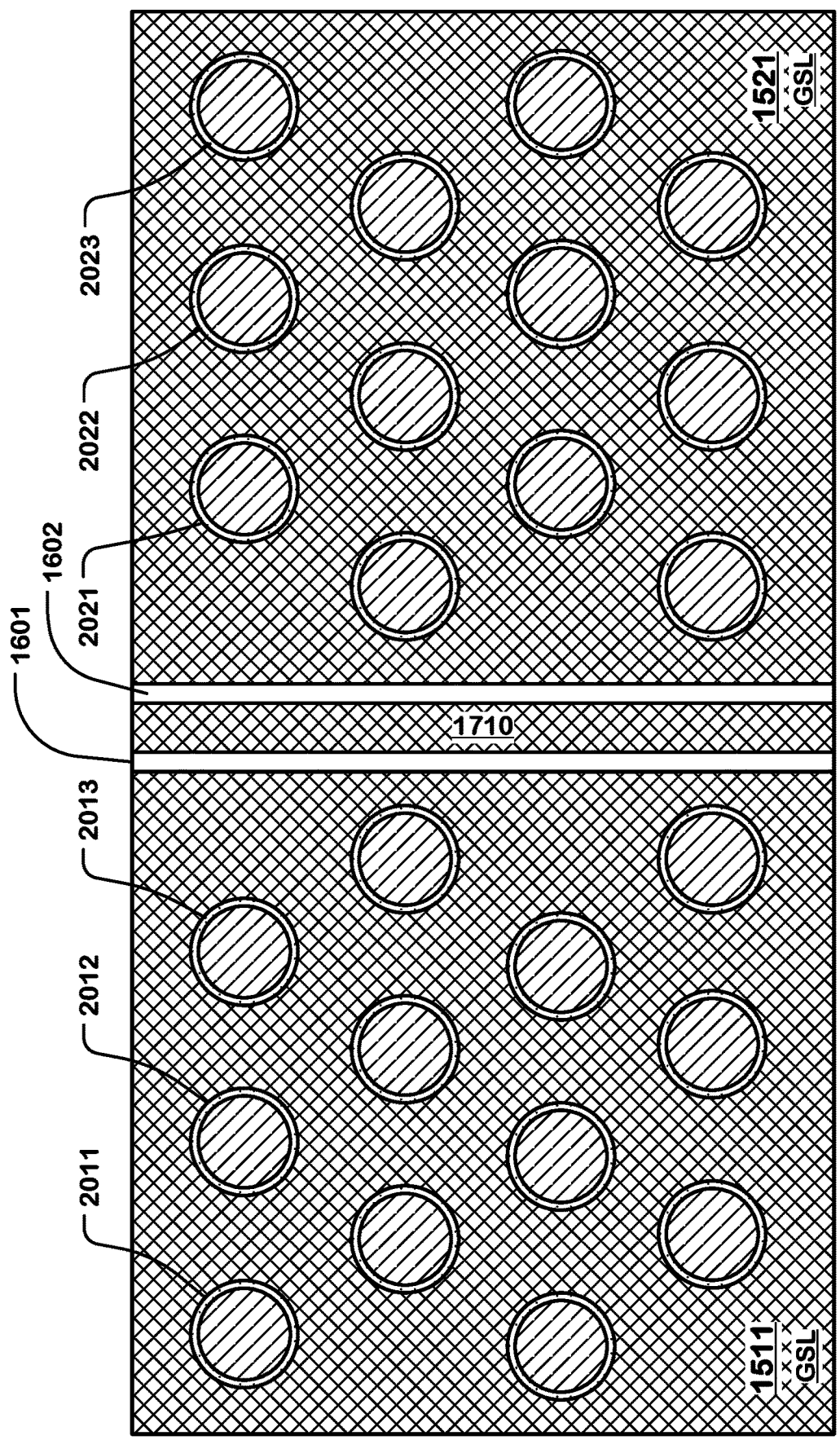

FIGS. 18-20 are simplified horizontal cross-sectional diagrams of a 3D memory device, at various levels of a stack of conductive strips separated by insulating layers.

FIG. 18 is a simplified horizontal cross-sectional diagram of a 3D memory device, at a level of an insulating layer in the stack. A source line 1710 is disposed through the conductive strips and the insulating layers in the stack, including an insulating layer 205. The source line 1710 is separated by spacers 1601 and 1602 from the stack.

A first array 1801 of memory cells is disposed on a first side of the source line 1710, and a second array 1802 of memory cells is disposed on a second side of the source line 1710 opposite the first side. An array, such as the first array 1801 and the second array 1802, can be arranged in a number R of rows and a number C of columns of memory cells. For example, a row in the first array 1801 can have C=3 memory cells, as indicated by horizontal cross-sections (e.g. 1811, 1812, 1813) of the 3 memory cells in the first array. A row in the second array 1802 can have C=3 memory cells, as indicated by horizontal cross-sections (e.g. 1821, 1822, 1823) of the 3 memory cells in the second array. Although as shown in the example of FIG. 18, R=4 and C=3, the number R can be greater than 4 and the number C can be greater than 3. In other embodiments, the array can be arranged as appropriate for a particular design.

The source line 1710 disposed through the stack is connected to the vertical channel structure (e.g. 1110, FIGS. 1, 1A), such as in memory cells in the first array 1801 and the second array 1802, via the substrate 201 and the crystalline semiconductor plugs (311, 312, FIG. 1).

Memory cells in the first array 1801 and the second array 1802 include vertical channel structures and charge storage structures including multiple layers of materials. The multiple layers of materials of the charge storage structures include a blocking layer 510, a charge storage layer 610, and a tunneling layer 910. A memory cell at a level of an insulating layer in the stack is further described in reference to FIG. 1A.

FIG. 19 is a simplified horizontal cross-sectional diagram of a 3D memory device, at a level of an intermediate plane in a plurality of intermediate planes of conductive strips in the stack. A source line 1710 is disposed through the conductive strips and the insulating layers in the stack, including an intermediate plane of conductive strips (1515, 1525). Conductive strips in the intermediate planes of conductive strips can be used as word lines (WL). The source line 1710 is separated by spacers 1601 and 1602 from the stack.

FIG. 19 illustrates horizontal cross-sections (e.g. 1911, 1912, 1913, 1921, 1922, 1923) of structures at a level of an intermediate plane in the stack, corresponding to horizontal cross-sections (e.g. 1811, 1812, 1813, 1821, 1822, 1823) of the memory cells in the first array 1801 and the second array 1802, as described in reference to FIG. 18.

The blocking layer 510, the charge storage layer 610, the tunneling layer 910, and the vertical channel structures (1010, 1110) are continuous through the conductive strips and the insulating layers in the stack, as shown in FIG. 1. The blocking layer 510 and the charge storage layer 610 are crenellated on recessed sidewalls of insulating layers, as shown in FIG. 1.

At a level of an insulating layer 205 in the stack (FIGS. 1A and 18), dielectric material 810 is disposed between the vertical channel structure (1010, 1110) and the charge storage layer 610. In contrast, at a level of an intermediate plane 1515 in the stack (FIGS. 1B and 19), there is only a tunneling layer 910 between the vertical channel structure (1010, 1110) and the charge storage layer 610. The vertical channel structure and charge storage structures at a level of an intermediate plane in the stack are further described in reference to FIGS. 1B and 1C.

FIG. 20 is a simplified horizontal cross-sectional diagram of a 3D memory device, at a level of a bottom plane of conductive strips in the stack. A source line 1710 is disposed through the conductive strips and the insulating layers in the stack, including a bottom plane of conductive strips (1511, 1521). Conductive strips in the bottom plane of conductive strips can be used as ground select lines (GSL). The source line 1710 is separated by spacers 1601 and 1602 from the stack.

FIG. 20 illustrates horizontal cross-sections (e.g. 2011, 2012, 2013, 2021, 2022, 2023) of crystalline semiconductor plugs (e.g. 311, FIG. 1D) at a level of a bottom plane in the stack, corresponding to horizontal cross-sections (e.g. 1811, 1812, 1813, 1821, 1822, 1823) of the memory cells in the first array 1801 and the second array 1802, as described in reference to FIG. 18. A crystalline semiconductor plug at a bottom plane in the stack is further described in reference to FIGS. 1D, 1E and 1F.

Figure 21:
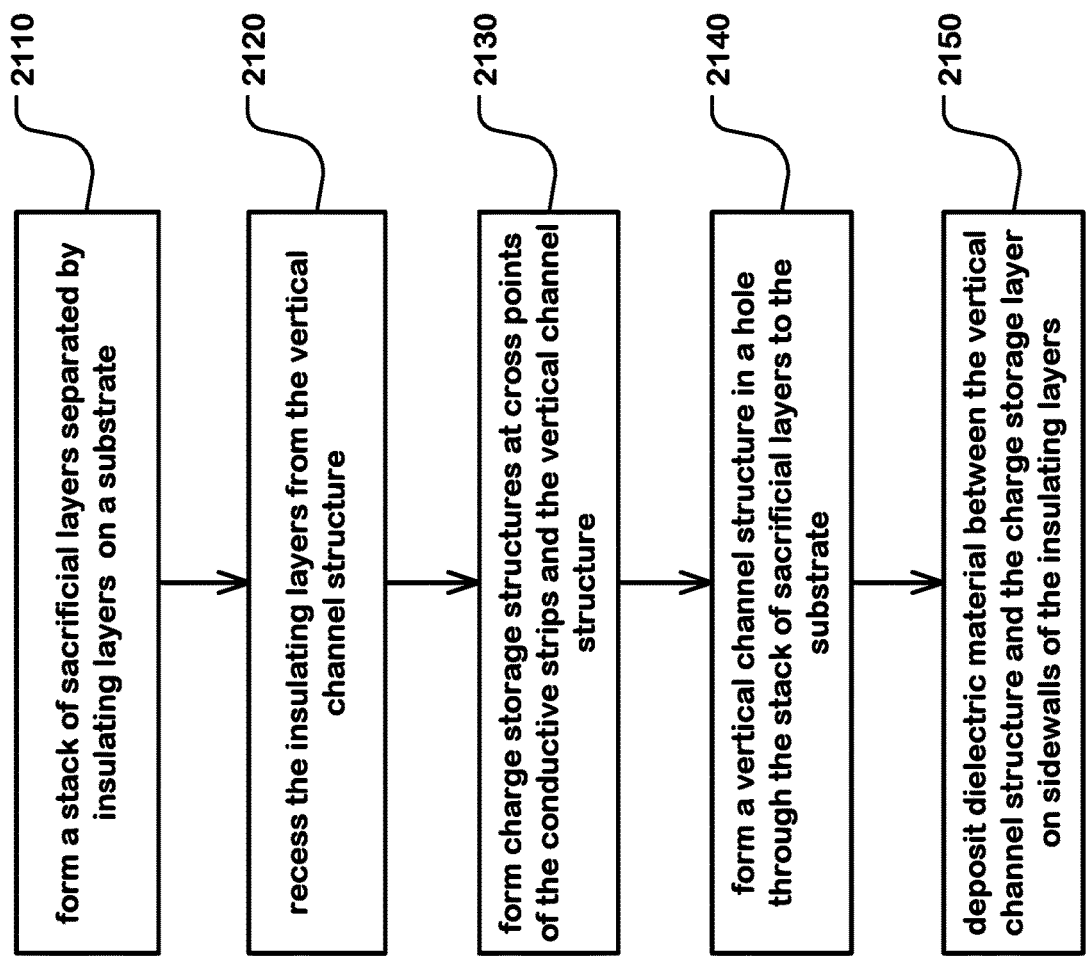
FIG. 21 is an example flowchart illustrating a manufacturing process for a 3D memory architecture including charge storage structures including a crenellated charge storage layer on recessed sidewalls of insulating layers.

FIG. 21 is an example flowchart illustrating a manufacturing process for a 3D memory architecture including charge storage structures including a crenellated charge storage layer on recessed sidewalls of insulating layers. At Step 2110, a stack of sacrificial layers (211-216, FIG. 2) separated by insulating layers (205) can be formed on a substrate (201). This step is further described in reference to FIG. 2.

At Step 2120, the insulating layers (205) can be recessed from the vertical channel structure. In one embodiment, this step can include recessing the insulating layers from sides (415, FIG. 4) of the sacrificial layers (215) exposed by the hole (231), so that the insulating layers are recessed from the vertical channel structure (1010, 1110, FIG. 11). This step is further described in reference to FIGS. 4 and 10.

At Step 2130, charge storage structures can be formed at cross points of the conductive strips and the vertical channel structure. The charge storage structures can include multiple layers of materials. A charge storage layer of the multiple layers of materials of the charge storage structures can line sidewalls of the insulating layers. In one embodiment, this step can include forming a blocking layer (510, FIG. 5) and a charge storage layer (610, FIG. 6) of the multiple layers of materials of the charge storage structures at the cross points of the conductive strips and the vertical channel structure. This step is further described in reference to FIGS. 5-6.

At Step 2140, a vertical channel structure can be formed in a hole (231, FIGS. 10-11) through the stack of sacrificial layers to the substrate. This step can include depositing a first channel film (1010, FIG. 10) over a tunneling layer (910) of the multiple layers of materials of the charge storage structure, and depositing a second channel film (1110, FIG. 11) over the first channel film. This step is further described in reference to FIGS. 10-11.

At Step 2150, dielectric material (810, FIG. 8) can be deposited between the vertical channel structure and the charge storage layer on sidewalls of the insulating layers, as further described in reference to FIGS. 7-8.

The order of the steps shown in the flowchart does not indicate the order in which the steps can be executed. For instance, Step 2150 for depositing dielectric material can be executed before Step 2140 for forming a vertical channel structure.

Figure 22:
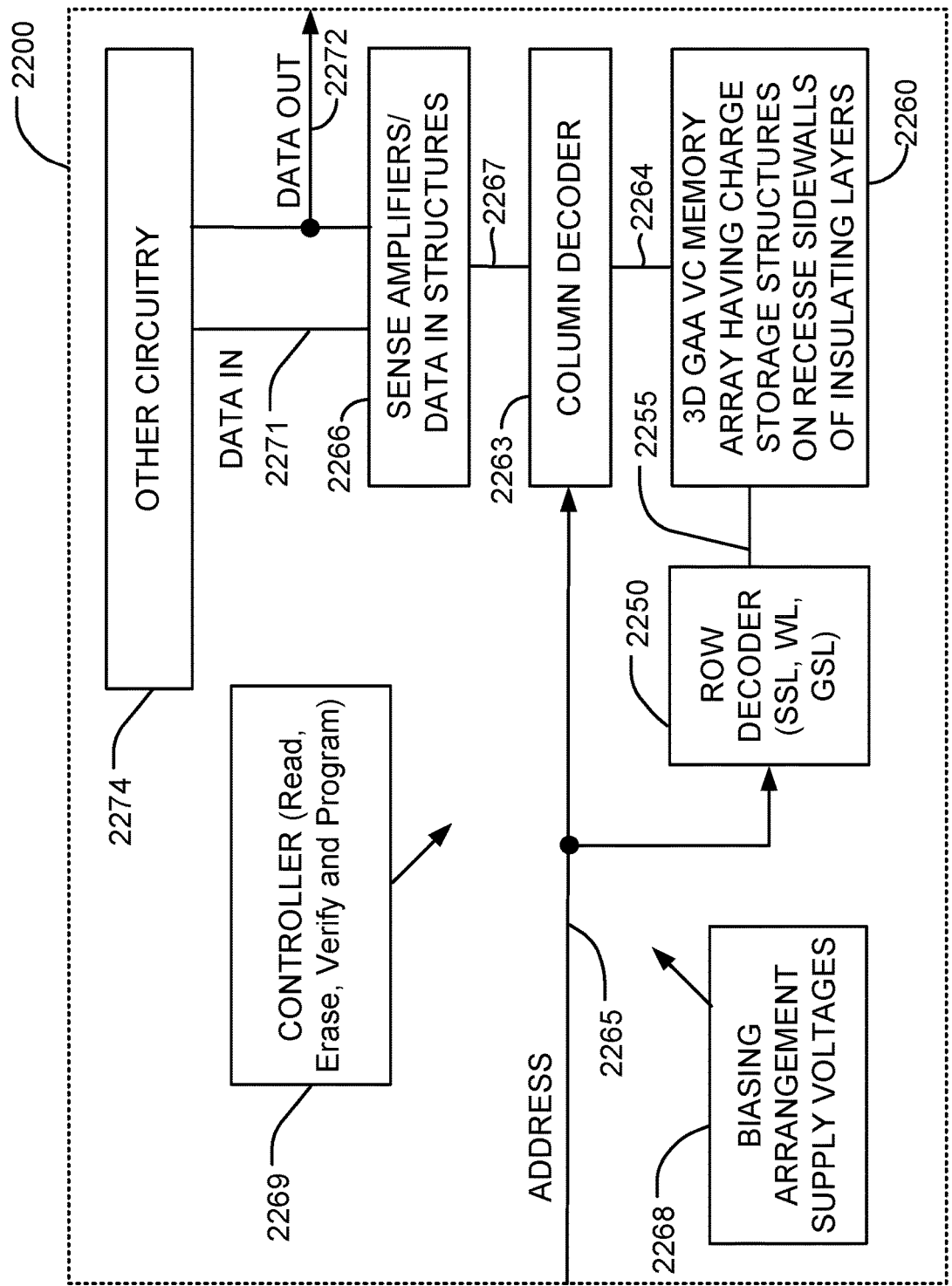
FIG. 22 is a block diagram of an integrated circuit memory in accordance with the present technology.

FIG. 22 is a block diagram of an integrated circuit memory device in accordance with the present technology. In the example shown in FIG. 22, the integrated circuit memory device 2200 includes a GAA (gate-all-around) VC (vertical channel) memory array 2260 including charge storage structures including a crenellated charge storage layer on recessed sidewalls of insulating layers.

The memory array 2260 comprises a stack of conductive strips separated by insulating layers on a substrate, and a vertical channel structure disposed in a hole through the stack of conductive strips to the substrate. Charge storage structures are disposed at cross points of the conductive strips and the vertical channel structure, the charge storage structures including multiple layers of materials. The insulating layers having sidewalls are recessed from the vertical channel structure, a charge storage layer of the multiple layers of materials of the charge storage structures lining the sidewalls of the insulating layers. The sidewalls of the insulating layers surround the vertical channel structure and the tunneling layer. Dielectric material is disposed between the vertical channel structure and the charge storage layer on sidewalls of the insulating layers.

The stack of conductive strips includes a top plane of conductive strips, a plurality of intermediate planes of conductive strips, and a bottom plane of conductive strips. A blocking layer and the charge storage layer of the multiple layers of materials of the charge storage structures are crenellated along sides of conductive strips in the plurality of intermediate planes and the sidewalls of the insulating layers. A tunneling layer of the multiple layers of materials of the charge storage structures is disposed over the charge storage layer and over the dielectric material.

A row decoder 2250 is coupled to a plurality of lines 2255 including string select lines SSL, word lines WL, and ground select lines GSL, and arranged along rows in the memory array 2260. A column decoder 2263 is coupled to a plurality of bit lines 2264 arranged along columns in the memory array 2260 for reading and programming data from the memory cells in the memory array 2260. Addresses are supplied on bus 2265 to column decoder 2263 and row decoder 2261. Sense amplifiers and data-in structures in block 2266 are coupled to the column decoder 2263 in this example via data bus 2267. Data is supplied via the data-in line 2271 from input/output ports on the integrated circuit 2200 or from other data sources internal or external to the integrated circuit 2200, to the data-in structures in block 2266. In the illustrated embodiment, other circuitry 2274 is included on the integrated circuit, such as a general purpose processor or special purpose application circuitry, or a combination of modules providing system-on-a-chip functionality supported by the programmable resistance cell array. Data is supplied via the data-out line 2272 from the sense amplifiers in block 2266 to input/output ports on the integrated circuit 2200, or to other data destinations internal or external to the integrated circuit 2200.

A controller 2269 implemented in this example using bias arrangement state machine controls the application of bias arrangement supply voltage generated or provided through the voltage supply or supplies in block 2268, such as read, verify, program and erase voltages. Controller 2269 can be configured to execute a program operation on memory cells in the memory array 2260.

The controller can be implemented using special-purpose logic circuitry as known in the art. In alternative embodiments, the controller comprises a general-purpose processor, which can be implemented on the same integrated circuit, which executes a computer program to control the operations of the device. In yet other embodiments, a combination of special-purpose logic circuitry and a general-purpose processor can be utilized for implementation of the controller.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
   a stack of conductive strips separated by insulating layers on a substrate, the stack of conductive strips including a top plane of conductive strips, a plurality of intermediate planes of conductive strips, and a bottom plane of conductive strips;
   a vertical channel structure disposed in a hole through the stack of conductive strips to the substrate;
   charge storage structures between sides of the conductive strips in the plurality of intermediate planes and sides of the vertical channel structure, the charge storage structures including multiple layers of materials;
   the insulating layers having sidewalls recessed from the vertical channel structure, a charge storage layer of the multiple layers of materials of the charge storage structures lining the sidewalls of the insulating layers; and
   dielectric material disposed between the vertical channel structure and the charge storage layer on sidewalls of the insulating layers, the charge storage layer disposed between the dielectric material and the insulating layers,
   wherein the dielectric material has a first vertical sidewall proximal to a tunneling layer of the multiple layers of materials of the charge storage structures and a second vertical sidewall proximal to the charge storage layer, the tunneling layer disposed between the first vertical sidewall of the dielectric material and the vertical channel structure.

2. The memory device of claim 1, wherein a blocking layer and the charge storage layer of the multiple layers of materials of the charge storage structures are crenellated along sides of conductive strips in the plurality of intermediate planes and the sidewalls of the insulating layers.

3. The memory device of claim 1, wherein the tunneling layer is in contact with the charge storage layer of the charge storage structures on the sides of the conductive strips in the intermediate planes.

4. The memory device of claim 3, wherein the sidewalls of the insulating layers surround the vertical channel structure and the tunneling layer.

5. The memory device of claim 1, the vertical channel structure comprising:
a first channel film in contact with the tunneling layer; and
a second channel film over the first channel film.

6. The memory device of claim 5, comprising:
a pad connected to the second channel film at an upper end.

7. The memory device of claim 1, comprising:
a crystalline semiconductor plug in the hole, the crystalline semiconductor plug disposed on and in contact with the substrate, the crystalline semiconductor plug having a top surface below the plurality of intermediate planes of conductive strips and above the bottom plane of conductive strips.

8. The memory device of claim 7, comprising:
an oxide on sides of the crystalline semiconductor plug, the oxide disposed between the crystalline semiconductor plug and conductive strips in the bottom plane of conductive strips.

9. The memory device of claim 7, wherein the vertical channel structure comprising:
a first channel film in contact with the tunneling layer; and
a second channel film over the first channel film and connected to the crystalline semiconductor plug.

10. The memory device of claim 7, comprising:
a layer of high-k material between the crystalline semiconductor plug and conductive strips in the bottom plane of conductive strips.

11. The memory device of claim 1, comprising:
a source line through the stack of conductive strips, the source line connected to the substrate and separated by spacers from conductive strips in the stack of conductive strips,
the spacers connected to a bottom insulating layer separating a bottom plane of conductive strips in the stack of conductive strips from the substrate.

12. The memory device of claim 1, comprising:
a layer of high-k material between the charge storage structures and conductive strips in the intermediate planes of conductive strips.

13. A manufacturing method, comprising:
forming a stack of sacrificial layers separated by insulating layers on a substrate, the stack of sacrificial layers including a top sacrificial layer, a plurality of intermediate sacrificial layers, and a bottom sacrificial layer;
recessing the insulating layers from sides of the sacrificial layers in a hole through the stack of sacrificial layers;
forming charge storage structures on sidewalls of the insulating layers and of the plurality of intermediate sacrificial layers, the charge storage structures including multiple layers of materials, a blocking layer and a charge storage layer of the multiple layers of materials of the charge storage structures lining the recessed sidewalls of the insulating layers;
forming a vertical channel structure in the hole;
forming dielectric material between the vertical channel structure and the charge storage layer on the recessed sidewalls of the insulating layers, the charge storage layer disposed between the dielectric material and the recessed sidewalls of the insulating layers; and
replacing the sacrificial layers in the stack with a conductive material;
wherein the charge storage structures are disposed between sides of the conductive material replacing sacrificial layers in the plurality of intermediate sacrificial layers and sides of the vertical channel structure, and the sidewalls of the insulating layers are recessed from the vertical channel structure,
wherein the dielectric material has a first vertical sidewall proximal to a tunneling layer of the multiple layers of materials of the charge storage structures and a second vertical sidewall proximal to the charge storage layer, the tunneling layer disposed between the first vertical sidewall of the dielectric material and the vertical channel structure.

14. The method of claim 13, wherein a blocking layer and the charge storage layer of the multiple layers of materials of the charge storage structures are crenellated along sides of sacrificial layers in the plurality of intermediate sacrificial layers and the sidewalls of the insulating layers.

15. The method of claim 13, comprising:
forming the tunneling layer in contact with the charge storage layer of the charge storage structures on the sidewalls of the intermediate sacrificial layers in the intermediate planes.

16. The method of claim 13, comprising:
forming a crystalline semiconductor plug in the hole, the crystalline semiconductor plug disposed on and in contact with the substrate, the crystalline semiconductor plug having a top surface below the plurality of intermediate sacrificial layers and above the bottom sacrificial layer.

17. The method of claim 16, comprising:
forming an oxide on sides of the crystalline semiconductor plug.

18. The method of claim 16, comprising:
said forming the charge storage structures comprising forming a blocking layer and the charge storage layer of the multiple layers of materials of the charge storage structures over the crystalline semiconductor plug;
depositing a tunneling layer over the charge storage layer over the crystalline semiconductor plug; and
said forming the vertical channel structure comprising depositing a first channel film of the vertical channel structure over the crystalline semiconductor plug.

19. The method of claim 13, replacing the sacrificial layers in the stack with the conductive material including:
etching a slit through the stack of sacrificial layers to the substrate, exposing the sacrificial layers in the stack;
removing the sacrificial layers in the stack via the slit to form horizontal openings between the insulating layers; and
depositing the conductive material in the horizontal openings to form a stack of conductive strips.

20. The method of claim 19, comprising:
forming spacers on sides of conductive strips in the stack of conductive strips in the slit, the spacers connected to a bottom insulating layer separating a bottom plane of conductive strips in the stack of conductive strips from the substrate; and forming a source line through the stack of conductive strips, the source line connected to the substrate and separated by the spacers from the conductive strips in the stack of conductive strips.

21. The method of claim 19, comprising:

forming a layer of high-k material in the horizontal openings at levels of the intermediate sacrificial layers.

22. The method of claim 19, wherein comprising:

forming a layer of high-k material in the horizontal openings at a level of the bottom sacrificial layer.

* * * * *